(12) United States Patent
Sugahara et al.

(10) Patent No.: US 11,158,511 B2
(45) Date of Patent: Oct. 26, 2021

(54) SEMICONDUCTOR DEVICE AND POWER CONVERTER INCLUDING A COPPER FILM WITH A SMALL GRAIN SIZE STRESS RELAXTION LAYER

(71) Applicant: Mitsubishi Electric Corporation, Chiyoda-ku (JP)

(72) Inventors: Kazuyuki Sugahara, Tokyo (JP); Hiroaki Okabe, Tokyo (JP); Motoru Yoshida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 32 days.

(21) Appl. No.: 16/078,938

(22) PCT Filed: Feb. 2, 2017

(86) PCT No.: PCT/JP2017/003750
§ 371 (c)(1),
(2) Date: Aug. 22, 2018

(87) PCT Pub. No.: WO2017/169086
PCT Pub. Date: Oct. 5, 2017

(65) Prior Publication Data
US 2019/0057873 A1 Feb. 21, 2019

(30) Foreign Application Priority Data
Mar. 30, 2016 (JP) .............................. JP2016-067388

(51) Int. Cl.
*H01L 23/522* (2006.01)
*H01L 21/28* (2006.01)
(Continued)

(52) U.S. Cl.
CPC .......... *H01L 21/28* (2013.01); *H01L 21/3205* (2013.01); *H01L 21/76* (2013.01);
(Continued)

(58) Field of Classification Search
CPC ..... H01L 23/522; H01L 29/12; H01L 29/739; H01L 29/78; H01L 21/28; H01L 21/3205; H01L 21/76; H01L 21/768
See application file for complete search history.

(56) References Cited

U.S. PATENT DOCUMENTS 6,429,523 B1 * 8/2002 Andricacos ....... H01L 21/76843
257/751
6,656,828 B1 12/2003 Maitani et al.
(Continued)

FOREIGN PATENT DOCUMENTS

CN 105305780 A 2/2016
JP 63-76456 A 4/1988
(Continued)

OTHER PUBLICATIONS

International Search Report dated Apr. 18, 2017 in PCT/JP2017/003750 filed Feb. 2, 2017.
(Continued)

*Primary Examiner* — Lex H Malsawma
(74) *Attorney, Agent, or Firm* — Xsensus LLP

(57) ABSTRACT

A semiconductor device that includes a semiconductor layer disposed on a semiconductor substrate, a first semiconductor region provided in an upper layer portion of the semiconductor layer, a second semiconductor region provided in an upper layer portion of the first semiconductor region, a gate insulation film, a gate electrode, a first main electrode that is provided on an interlayer insulation film that covers the gate electrode and that is electrically connected to the second semiconductor region via a contact hole, and a second main electrode disposed on a second main surface of the semiconductor substrate. The first main electrode includes an underlying electrode film connected to the second semiconductor region via the contact hole, and a copper film provided on the underlying electrode film. The copper film
(Continued)

includes at least a portion that serves as a stress relaxation layer having a smaller grain size than the other portion of the copper film.

6 Claims, 22 Drawing Sheets

(51) Int. Cl.
  *H01L 21/3205*    (2006.01)
  *H01L 21/76*    (2006.01)
  *H01L 29/739*    (2006.01)
  *H01L 21/768*    (2006.01)
  *H01L 29/78*    (2006.01)
  *H01L 29/12*    (2006.01)

(52) U.S. Cl.
  CPC .......... *H01L 21/768* (2013.01); *H01L 23/522* (2013.01); *H01L 29/12* (2013.01); *H01L 29/739* (2013.01); *H01L 29/78* (2013.01)

(56) References Cited

U.S. PATENT DOCUMENTS

| | | | |
|---|---|---|---|
| 8,895,431 B2 | 11/2014 | Harada et al. | |
| 2003/0224592 A1* | 12/2003 | Harada | H01L 21/76807 |
| | | | 438/622 |
| 2006/0290000 A1 | 12/2006 | Worwag et al. | |
| 2010/0148244 A1* | 6/2010 | Kitabatake | H01L 24/06 |
| | | | 257/328 |
| 2010/0308421 A1* | 12/2010 | Muto | H01L 23/49575 |
| | | | 257/401 |
| 2011/0284874 A1* | 11/2011 | Miura | H01L 29/7811 |
| | | | 257/77 |
| 2013/0095652 A1 | 4/2013 | Harada et al. | |
| 2014/0042450 A1 | 2/2014 | Akiyama et al. | |
| 2016/0011266 A1 | 1/2016 | Osanai | |
| 2017/0222168 A1* | 8/2017 | Ikeda | H01L 51/0545 |

FOREIGN PATENT DOCUMENTS

| | | |
|---|---|---|
| JP | 2000-31095 A | 1/2000 |
| JP | 2006-54278 A | 2/2006 |
| JP | 2008-311383 A | 12/2008 |
| JP | 2008-544077 A | 12/2008 |
| JP | 2010-92895 A | 4/2010 |
| JP | 2014-38886 A | 2/2014 |
| JP | 2014-82367 A | 5/2014 |
| JP | 2014-110362 A | 6/2014 |
| JP | 5834189 B2 | 11/2015 |
| JP | 2016-6827 A | 1/2016 |
| JP | 5879464 B1 | 2/2016 |
| WO | WO 00/44043 A1 | 7/2000 |
| WO | WO 2007/002956 A1 | 1/2007 |

OTHER PUBLICATIONS

Japanese Office Action dated Jul. 28, 2017 in Japanese Patent Application No. 2017-530775 (with English Translation).
Office Action dated Dec. 2, 2020, in corresponding Chinese patent Application No. 201780017010.8, 15 pages.

* cited by examiner

F I G . 1
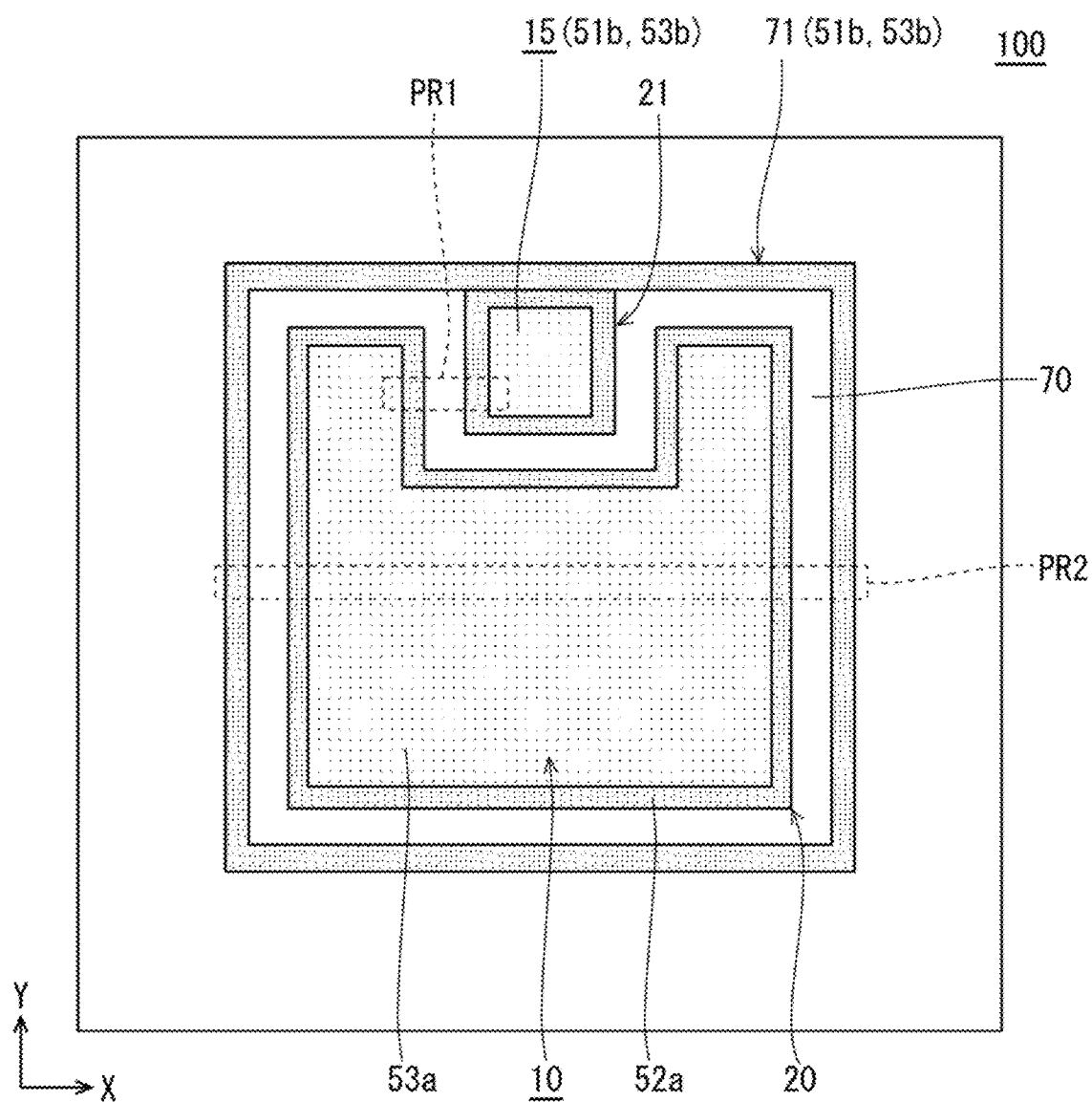

F I G. 2
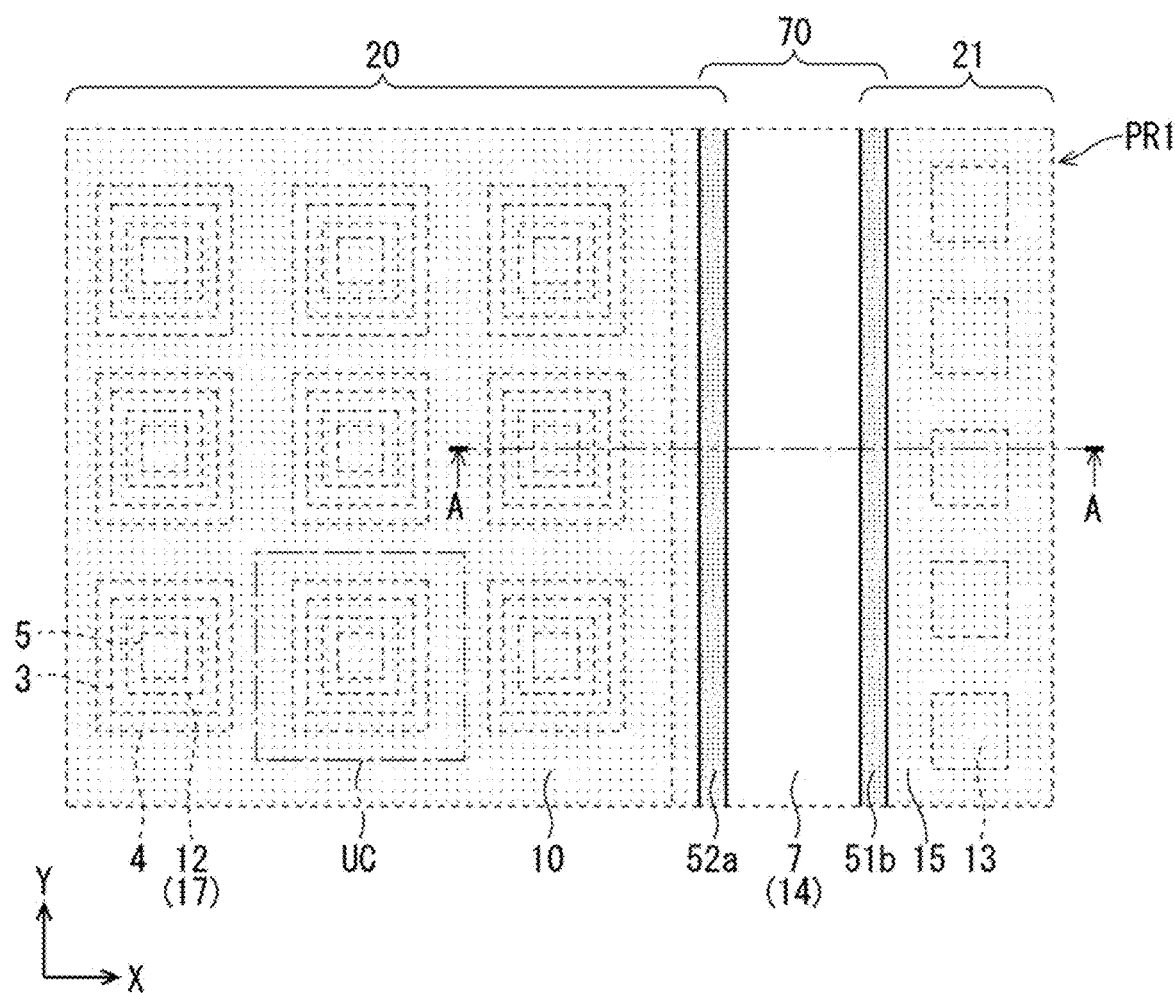

F I G . 3
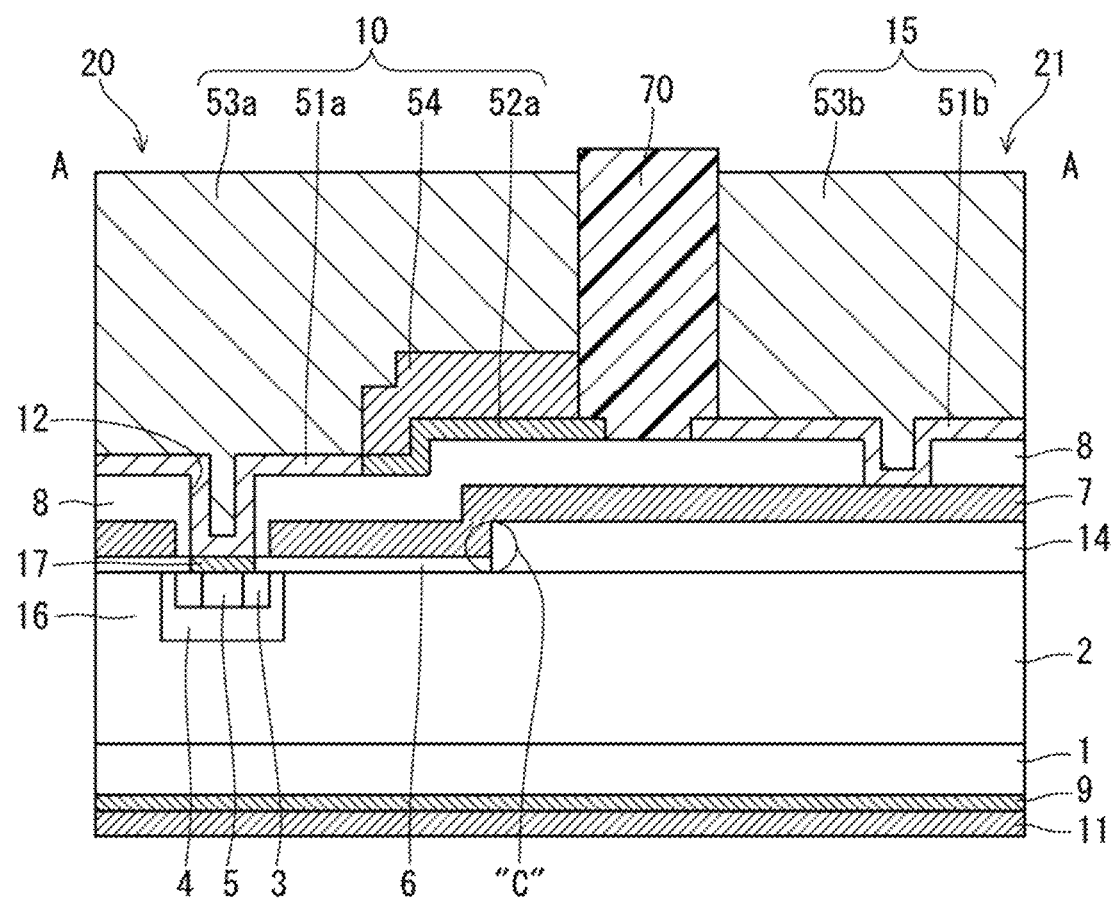
F I G . 4
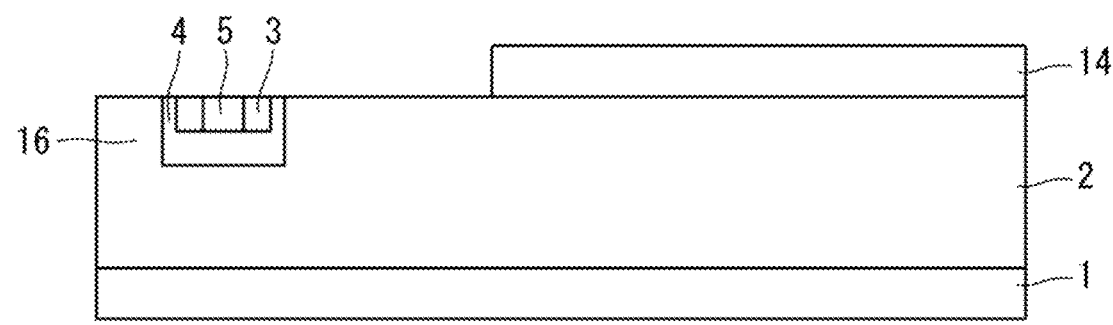

F I G . 5
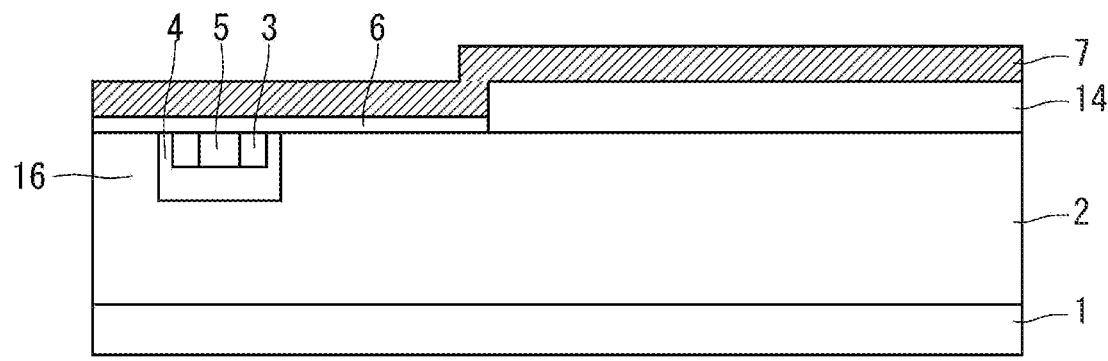
F I G . 6
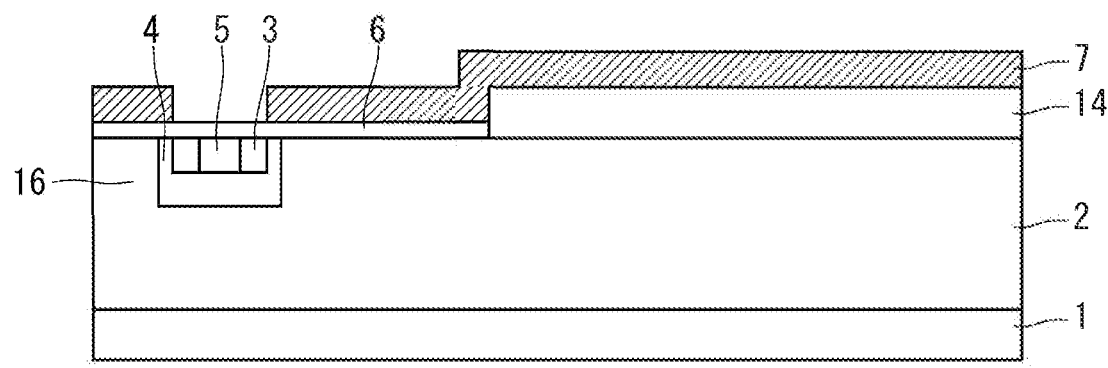

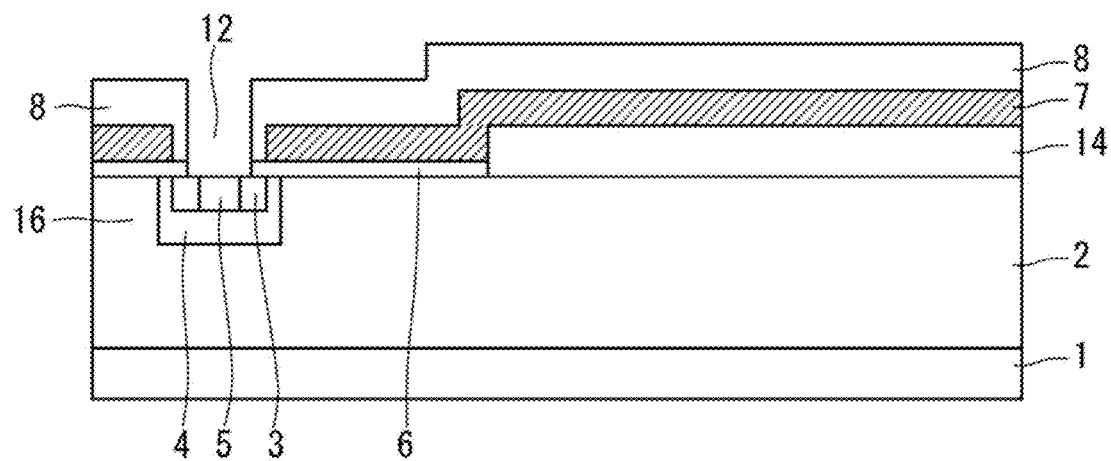
F I G . 7

F I G . 1 0
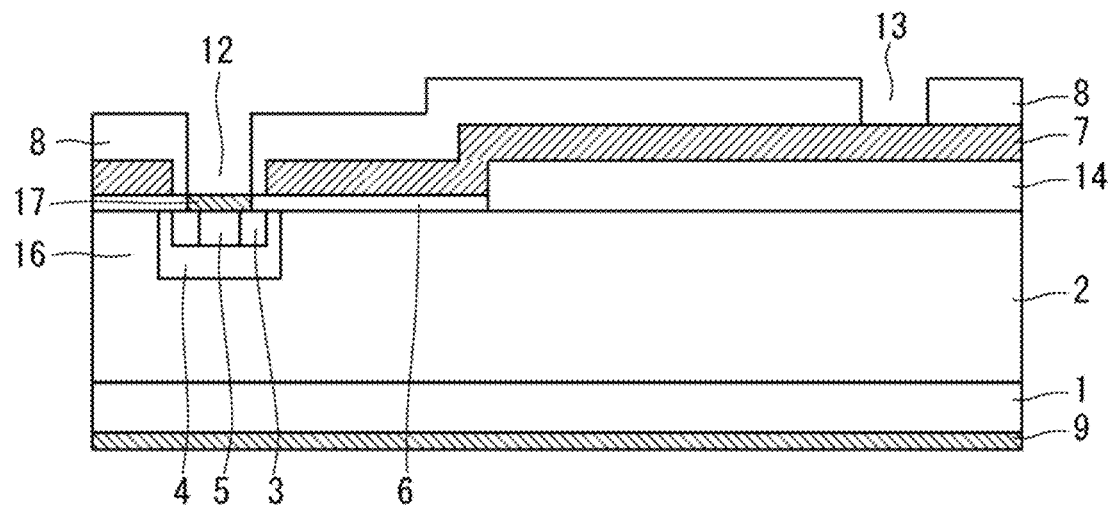
F I G . 1 1
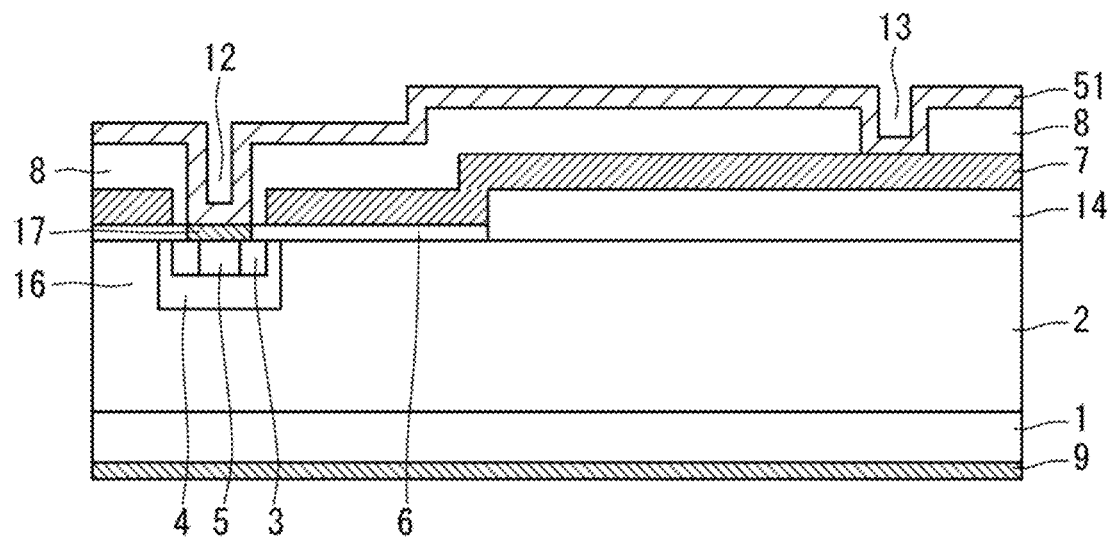

F I G . 1 4
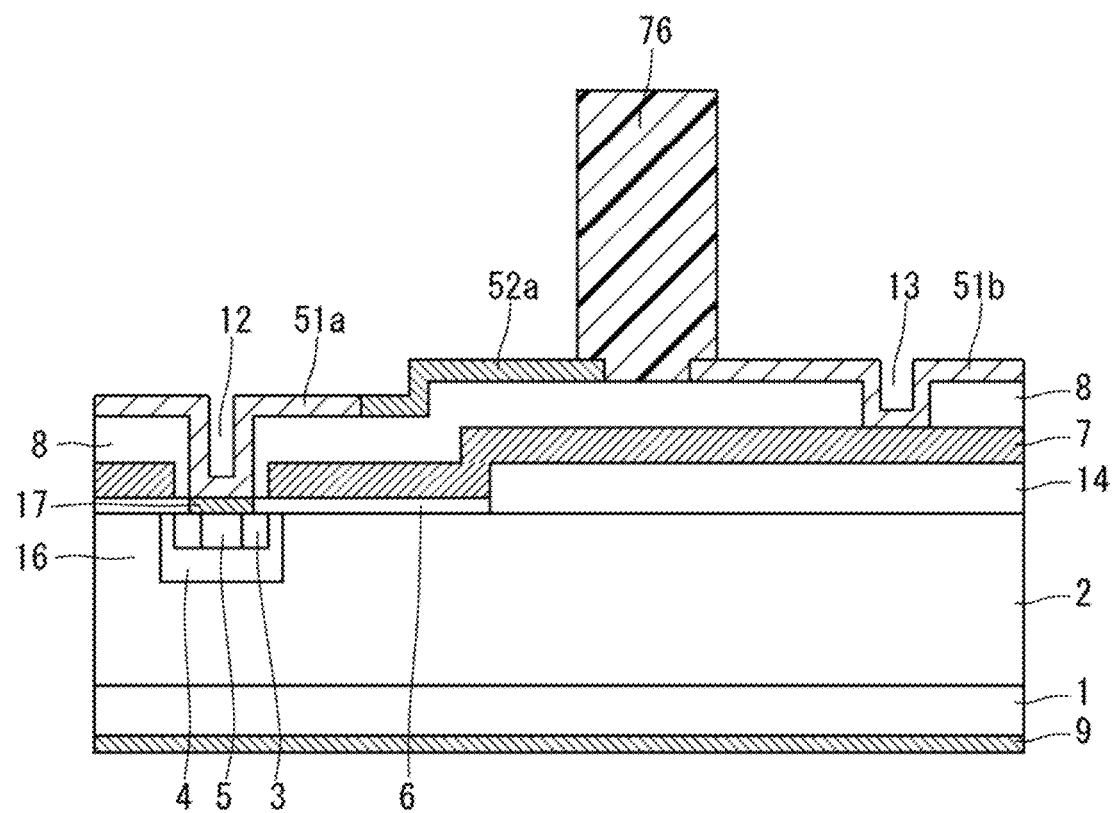

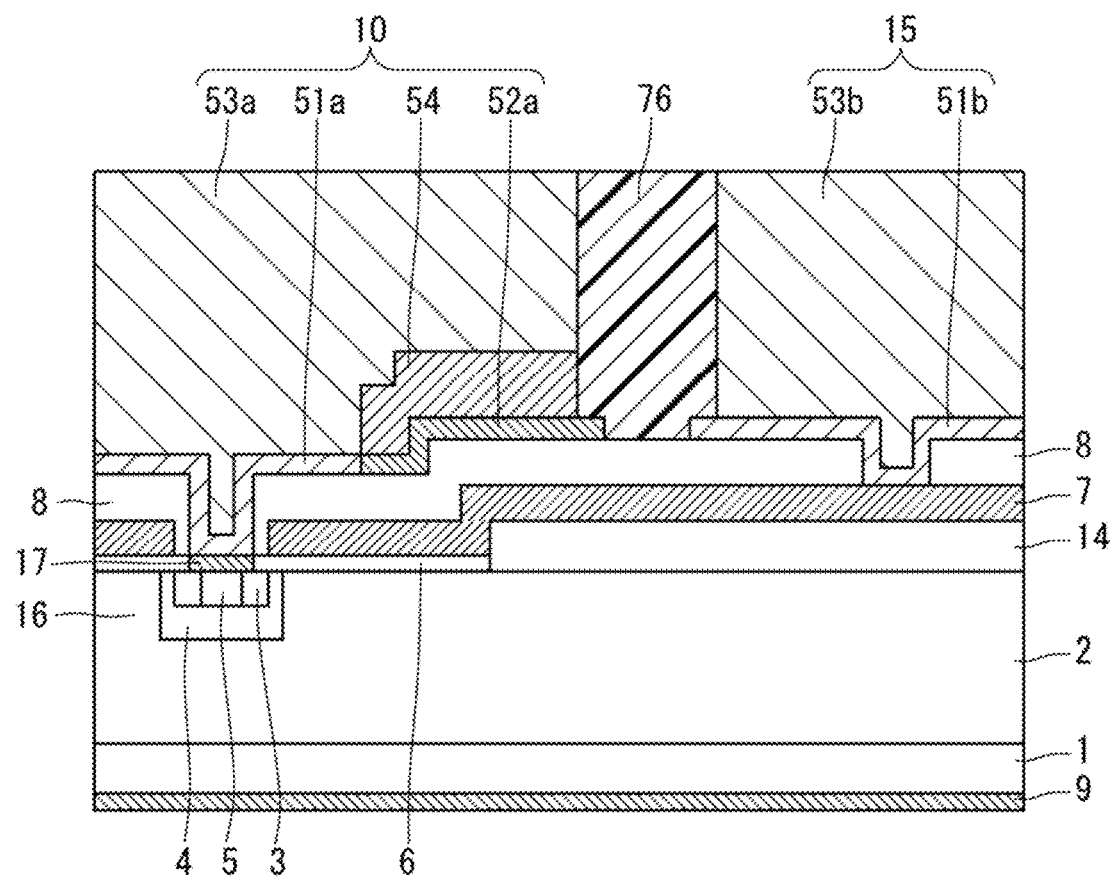
F I G . 1 5

F I G . 2 6
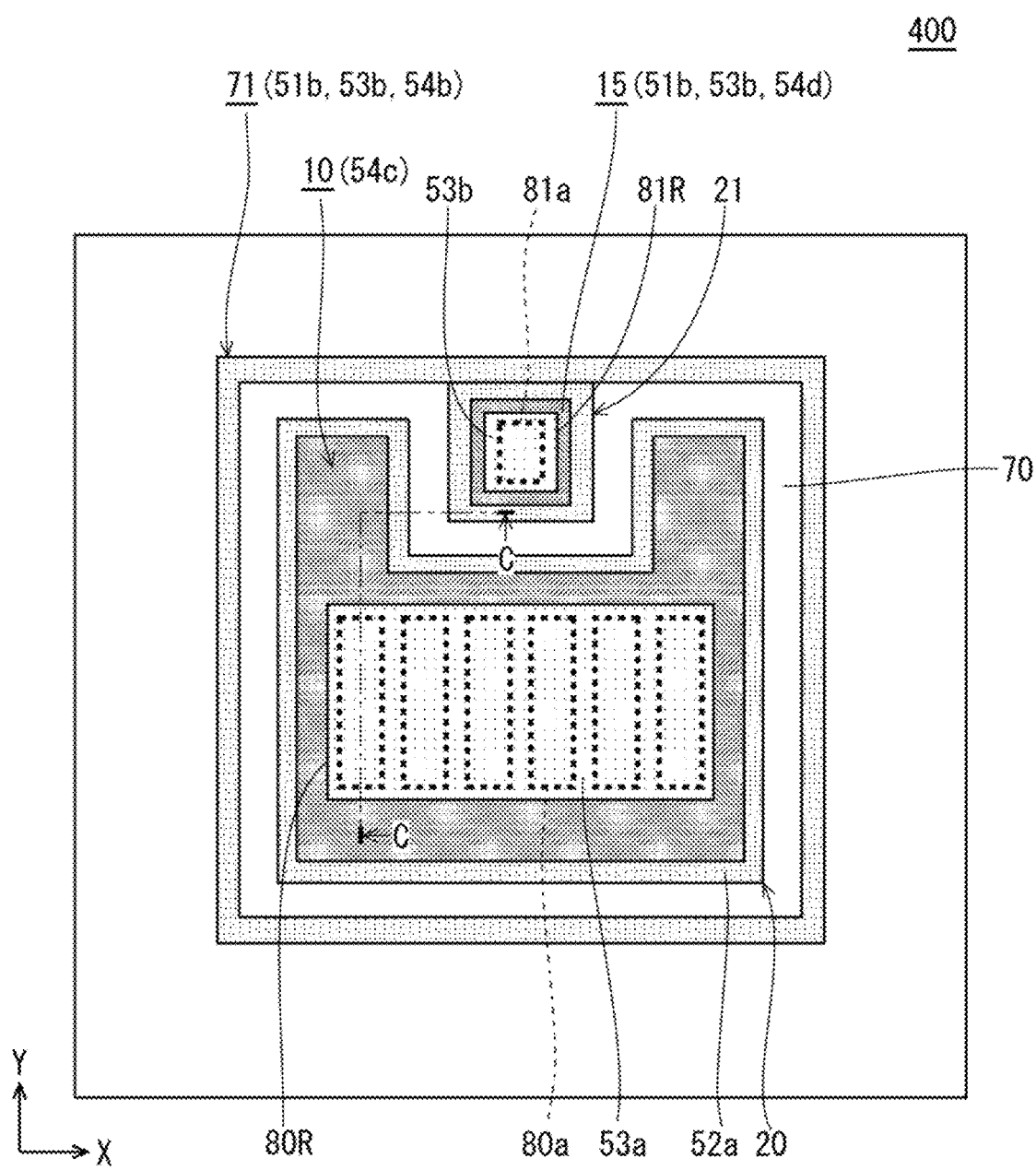

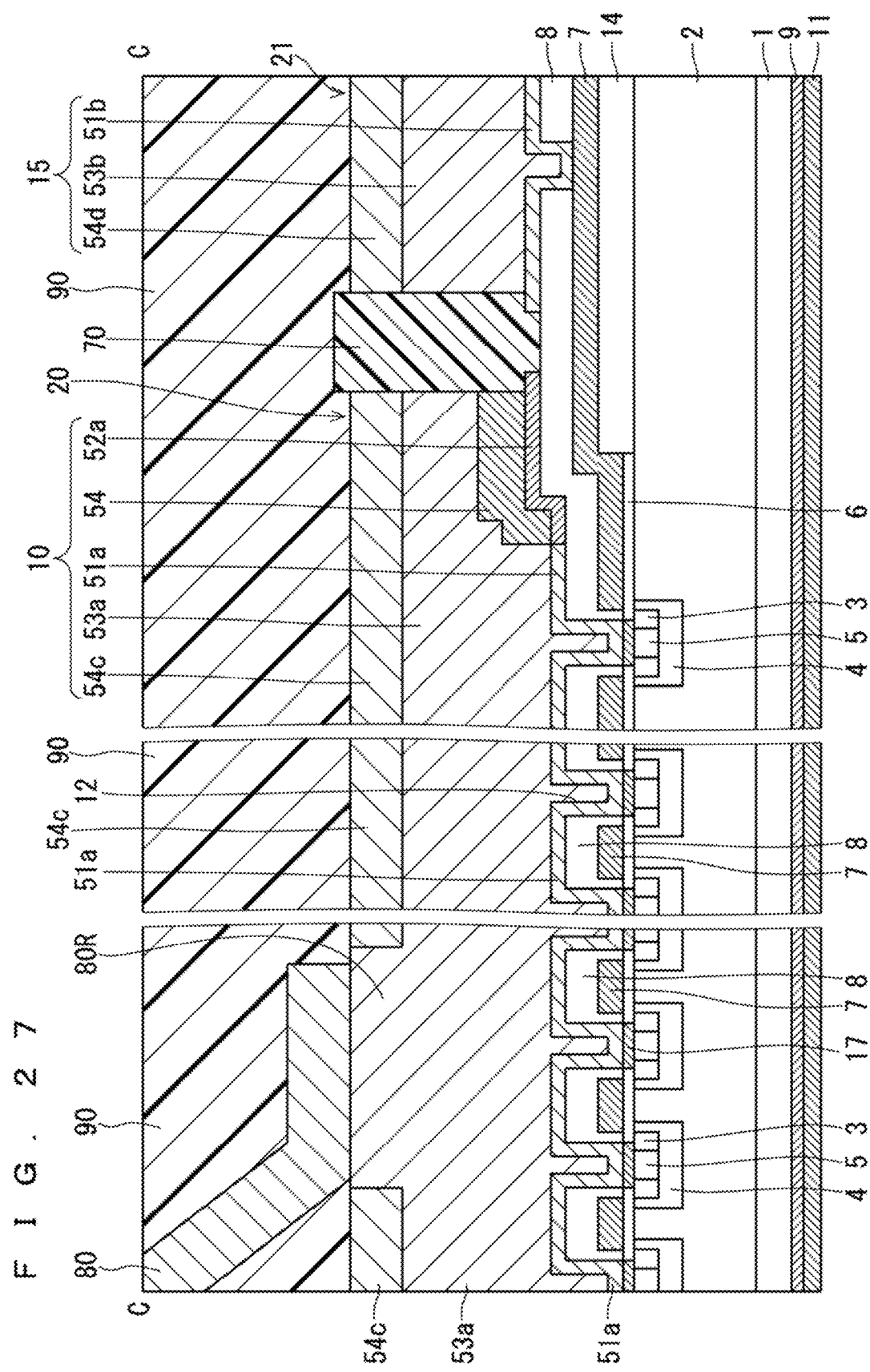

F I G. 2 8
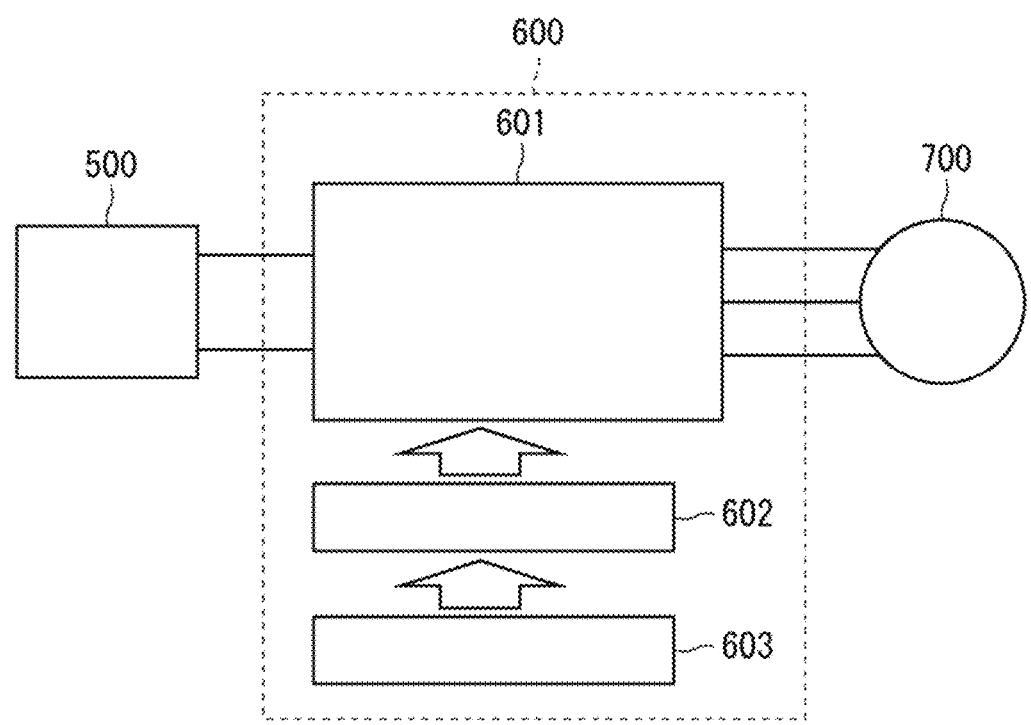

US 11,158,511 B2

SEMICONDUCTOR DEVICE AND POWER CONVERTER INCLUDING A COPPER FILM WITH A SMALL GRAIN SIZE STRESS RELAXTION LAYER

TECHNICAL FIELD

The present invention relates to a semiconductor device, and in particular to a semiconductor device having an improved short circuit current capability.

BACKGROUND ART

Power electronics equipment uses switching devices such as silicon insulated gate bipolar transistors (IGBTs) and metal oxide semiconductor field effect transistors (MOSFETs) as means for switching the start and stop of power supply for driving loads such as electric motors. The application of silicon carbide MOSFETs and silicon carbide IGBTs is also being considered for high-voltage devices whose rated voltages are in the neighborhood of 1 kV or greater than or equal to 1 kV. These switching devices are both insulated gate type semiconductor devices.

Silicon carbide (SiC) semiconductors have wider band gaps than silicon (Si) semiconductors. SiC semiconductor devices using SiC semiconductors have higher voltage resistance, higher permissible current densities, and higher heat resistance than Si semiconductor devices using Si semiconductors, thus being capable of high-temperature operations. Accordingly, SiC semiconductor devices are under development as next-generation power semiconductor devices.

An example of particularly important devices among MOSFETs used as power semiconductor devices is a vertical MOSFET. The vertical MOSFET includes a semiconductor layer obtained by laminating layers such as an N-type semiconductor layer, a drift layer, and a P-type semiconductor layer where a channel is formed, and electrodes such as a source electrode, a gate electrode, and a drain electrode.

The vertical MOSFET has the source electrode and the gate electrode formed on the front face side of the semiconductor layer and the drain electrode formed on the rear face side of the semiconductor layer. There are various types of vertical MOSFETs, such as the planar type and the trench type, depending on their difference in gate structure.

IGBTs used as power semiconductor devices are configured such that the N-type semiconductor layer serving as the drain of the above-described vertical MOSFET is replaced by a P-type semiconductor layer so as to form a collector. IGBTs are used as switching devices for higher voltages because they are capable of passing a larger current than vertical MOSFETs.

For example, SiC-MOSFETs using SiC employ a structure compliant with the device structure of Si-MOSFETs using Si. Since SiC has a wider band gap than Si, SiC-MOSFETs are capable of higher temperature operations than Si-MOSFETs, which operate at temperatures less than 200° C.

Power semiconductor devices (power devices) employ a configuration in which an aluminum (Al) wire is joined by wire bonding to an Al electrode (source electrode) formed on a device surface so as to extract current. Patent Document 1 discloses a configuration in which an AlCu electrode is formed on a chip (power device) and an AlCu wire is joined to the AlCu electrode, AlCu being an alloy obtained by mixing a small amount of copper (Cu) in Al. However, the reliability in joining the Al wire by wire bonding is low during operations at high temperatures exceeding 200° C., and it gives difficulty for power devices to operate at high temperatures. In view of this, consideration is being given to wire bonding using a copper (Cu) wire that is highly reliable at high temperatures, instead of wire bonding using an Al wire. As compared with the wire bonding using an Al wire, the wire bonding using a Cu wire makes a strong impact on a device at the time of joining and therefore may cause the failure of the device. In particular, the impact on power devices is strong because the power devices extract a large current and thus need to increase the wire diameter. Thus, the wire bonding using a Cu wire may cause device failures if the device surface to which the Cu wire is joined has an inadequate electrode structure.

Patent Document 2 discloses a configuration that includes an electrode for joining a Cu wire by bonding to an SiC semiconductor device, and discloses an electrode structure in which the uppermost layer of the electrode is a Cu layer, and at least one protective layer whose hardness is equal to or higher than the hardness of tantalum (Ta) is provided below the Cu layer. The Cu layer has a thickness of 10 pun, and the presence of the Cu layer prevents the occurrence of cracks in a semiconductor device region that is directly below the Cu layer.

Patent Document 3 discloses an electrode structure in which a Cu layer and an organic insulation layer configured by a polyimide layer are formed on a semiconductor device, and the surface of the Cu layer is covered with a barrier layer. The Cu layer is assumed to have a thickness of 10 μm.

PRIOR ART DOCUMENTS

Patent Documents

Patent Document 1: Japanese Patent Application Laid-Open No. 2008-311383
Patent Document 2: Japanese Patent Application Laid-Open No. 2014-082367
Patent Document 3: International Publication No. WO 00/44043

SUMMARY

Problem to be Solved by the Invention

As described above, in the case of using a Cu wire, it is necessary to increase the film thickness of a Cu electrode on a surface so as to prevent a semiconductor device from being damaged by the impact of wire bonding.

Also, a power switching device may operate in a short circuit state due to, for example, the occurrence of a short circuit, i.e., in a state in which no loads (e.g., inductance) are connected, and if a semiconductor device is turned on in this state, a large current flows through the switching device. If this current flow continues, a rapid temperature rise occurs in the device itself and causes damage to the device. This duration of time from the start of flow of overcurrent to the occurrence of damage is called a short circuit current capability, which is one of important indicators of switching devices. If the switching device operates in a short circuit state and a current flows, heat generated by the current flow is diffused to the front and rear face sides of the semiconductor device. In order to improve the short circuit current capability, it is conceivable to increase the thickness of the Cu electrode so as to cause the thick Cu electrode to absorb the heat generated by short-circuit current.

However, if the thickness of the Cu electrode serving as the front main electrode of the semiconductor device is increased to 10 μm or higher, a new problem arises in which, before wire bonding, the stress of the thick Cu electrode causes cracks in an SiC substrate and an insulation film that are in contact with the Cu electrode.

The present invention has been made in view of the problems described above, and it is an object of the present invention to provide a semiconductor device that has an improved short circuit current capability and that does not cause any problems arising from the thickness of the front main electrode.

Means to Solve the Problem

A semiconductor device according to the present invention includes a semiconductor substrate, a semiconductor layer of a first conductivity type disposed on a first main surface of the semiconductor substrate, a first semiconductor region of a second conductivity type selectively provided in an upper layer portion of the semiconductor layer, a second semiconductor region of the first conductivity type selectively provided in an upper layer portion of the first semiconductor region, a gate insulation film provided in contact with surfaces of the first and second semiconductor regions and the semiconductor layer, an insulation film that is thicker than the gate insulation film and provided in a region of the semiconductor layer in which the gate insulation film is not provided, a gate electrode provided on at least the gate insulation film, an interlayer insulation film provided to cover the gate electrode, a contact hole formed through the gate insulation film and the interlayer insulation film and exposing at least the second semiconductor region at a bottom thereof, a first main electrode provided on the interlayer insulation film and electrically connected to the second semiconductor region via the contact hole, and a second main electrode disposed on a second main surface of the semiconductor substrate. The first main electrode includes an underlying electrode film connected to the second semiconductor region via the contact hole, and a copper film provided on the underlying electrode film. The copper film has a thickness greater than or equal to 15 μm, and includes a stress relaxation layer having a smaller grain size than the other portion of the copper film, above a region that includes at least a junction between the gate insulation film and the insulation film.

Effects of the Invention

With the semiconductor device according to the present invention, since the stress relaxation layer is provided in the copper film constituting the first main electrode, the stress of the copper film is relaxed. This avoids stress concentration in the region including the junction between the gate insulation film and the insulation film in the lower portion of the first main electrode and prevents the occurrence of cracks in the gate insulation film and the insulation film in that region, thus achieving a highly reliable semiconductor device.

BRIEF DESCRIPTION OF DRAWINGS

FIG. 1 is a top view of a semiconductor device according to the present invention.

FIG. 2 is a plan view schematically illustrating each impurity region formed in a main surface of a silicon carbide semiconductor device according to Embodiment 1 of the present invention.

FIG. 3 is a sectional view of the silicon carbide semiconductor device according to Embodiment 1 of the present invention.

FIGS. 4 to 15 are sectional views for describing a step of manufacturing the silicon carbide semiconductor device according to Embodiment 1 of the present invention.

FIGS. 25 and 26 are top views of a silicon carbide semiconductor device according to Embodiment 4 of the present invention.

FIG. 27 is a sectional view of the silicon carbide semiconductor device according to Embodiment 4 of the present invention.

FIG. 28 is a block diagram illustrating a configuration of a power conversion system according to Embodiment 5 of the present invention.

DESCRIPTION OF EMBODIMENTS

Introduction

Figure 8:
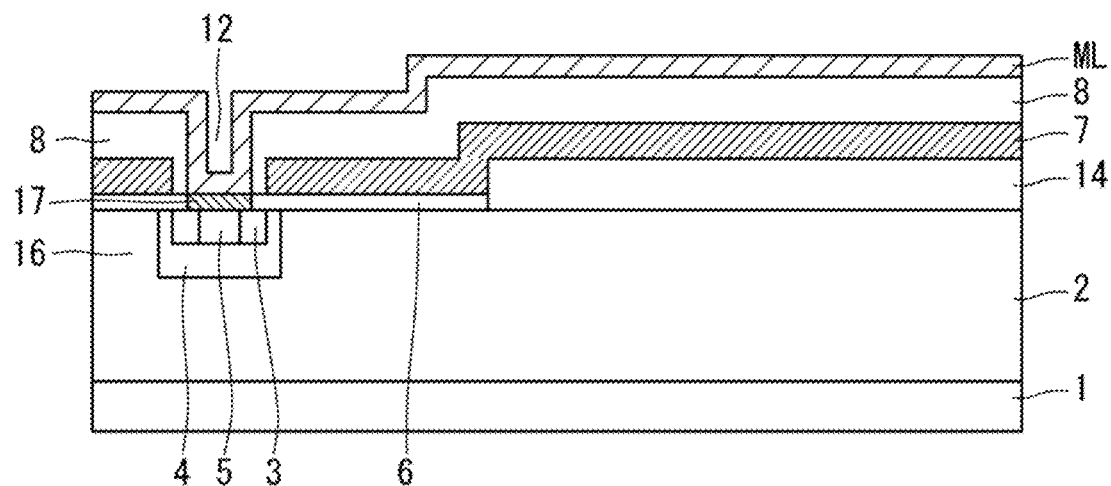

The term MOS has formerly been used for a junction structure of a metal, an oxide, and a semiconductor and is named after the initials of Metal-Oxide-Semiconductor. However, in particular in field-effect transistors having a MOS structure (hereinafter, simply referred to as "MOS transistors"), materials for the gate insulation film and the gate electrode have been improved from the viewpoints of, for example, integration in recent years and an improvement in the manufacturing process.

For example, MOS transistors have employed polycrystalline silicon as the material for the gate electrode, instead of metal, primarily from the viewpoint of forming the source and the drain in a self-alignment manner. Also, a high dielectric constant material has been employed as the material for the gate insulation film from the viewpoint of improving electrical characteristics, but this material is not necessarily limited to an oxide.

From the above, the term MOS is not limitedly used for a laminated structure of a metal, an oxide, and a semiconductor, and the specification of the present invention is also not premised on such a limitation. That is, in light of common general technical knowledge, the term MOS as used herein not only refers to an abbreviation derived from the term, but also has a meaning that widely includes laminated structures of a conductor, and an insulator, and a semiconductor.

Although in the following description, the conductivity type of impurities are defined such that an n-type is a "first conductivity type" and a p-type is a "second conductivity type," this definition may be reversed.

Embodiment 1

Device Configuration

FIG. 1 is a plan view schematically illustrating an upper surface configuration of a silicon carbide semiconductor device according to Embodiment 1 of the present invention, and more specifically, a field-effect transistor having a MOS structure (silicon carbide MOSFET) 100 formed on an SiC substrate (silicon carbide semiconductor substrate). Although the silicon carbide MOSFET 100 is described as being of a planar gate type, the application of the present invention is not limited to the planar gate type, and a semiconductor is not limited to silicon carbide.

As illustrated in FIG. 1, the silicon carbide MOSFET 100 has a quadrangular outside shape, and a gate line 71 is provided to surround the outer edge of the silicon carbide MOSFET 100. In the central portion of a main surface (front main surface) of the silicon carbide MOSFET 100 is a cell arrangement region 20 in which a plurality of minimum unit structures of the MOS, which are referred to as "unit cells," are arranged, and the outer edge of the cell arrangement region 20 is defined by an underlying electrode film 52a.

The shape of the cell arrangement region 20 in plan view is a quadrangular shape whose one side is recessed inwardly in the central portion, and a gate pad 21 is provided so as to get in a portion formed by the inward recess of the cell arrangement region 20. The outer edge of the gate pad 21 is defined by a quadrangular underlying electrode film 51b, and an external output gate electrode 15 is provided in the central portion of the underlying electrode film 51b in plan view. The cell arrangement region 20, the gate pad 21, and the gate line 71 are spaced from one another.

A gate voltage is applied from an external control circuit (not shown) to the external output gate electrode 15 of the gate pad 21, and the applied gate voltage is supplied to the gate electrodes of the unit cells through the gate line 71.

Also, an external output source electrode 10 (first main electrode) that connects the source electrode (not shown) of each unit cell in parallel is formed in the cell arrangement region 20.

In FIG. 1, a Cu film 53a is provided on the outermost surface of the external output source electrode 10, and a Cu film 53b is provided on the outermost surface of the external output gate electrode 15. The other regions, except the regions where the Cu films 53a and 53b are provided, are covered with a resin film that is transparent and thus not shown, so that in the illustration, films under the resin film, such as the underlying electrode film 52a, are visually recognizable.

Although ordinary products often further include electrodes for temperature sensors and current sensors, the presence or absence of such electrodes are irrelevant to the configuration and effects of the present invention, and therefore description and illustration thereof have been omitted.

Also, although the features of MOSFETs such as the positions and number of gate pads 21, the shape of the gate line 71, and the shapes and number of cell arrangement regions 20 vary widely, such features are also irrelevant to the configuration and effects of the present invention, and therefore description and illustration thereof have been omitted.

FIG. 2 is a plan view schematically illustrating a configuration of a region PR1 illustrated in FIG. 1. The region PR1 defines a region that ranges from part of the edge portion of the cell arrangement region 20 on the side facing the gate pad 21 to part of the edge portion of the gate pad 21 that faces the edge portion of the cell arrangement region 20.

The cell arrangement region 20 has a plurality of unit cells UC (in the present example, unit cells of a vertical MOSFET) arranged in a matrix, whereas the gate pad 21 has no unit cells and has a plurality of gate contact holes 13 arranged therein.

Although FIG. 2 illustrates an example in which the unit cells UC are arranged in three rows and three columns in the up, down, right, and left directions in the cell arrangement region 20, this array is merely part of the cell arrangement region 20, and the entire cell arrangement region 20 has a larger number of unit cells arranged therein.

As illustrated in FIG. 2, the shape of each unit cell UC in plan view is such that a contact region 5 having a generally quadrangular outside shape is surrounded by a source region 3, and the outer periphery of the source region 3 is surrounded by a well region 4. A source contact hole 12 is provided so as to come into contact with the contact region 5 and part of the source region 3 surrounding the contact region 5, and a silicide film 17 made of nickel silicide ($NiSi_2$) is provided at the bottom of the source contact hole 12 so that the contact region 5 is covered with the silicide film 17. Note that the external output source electrode 10 (which is hatched) is embedded in the source contact hole 12. The details of the configuration of the external output source electrode 10 will be described later.

The gate pad 21 is provided above a gate electrode 7 provided on a silicon oxide film 14 (insulation film), and the gate electrode 7 is electrically connected to the external output gate electrode 15 (which is hatched) provided above, via the gate contact holes 13. The details of the configuration of the external output gate electrode 15 will be described later.

Next, a sectional configuration taken along line A-A in FIG. 2 will be described with reference to a sectional view in FIG. 3. As illustrated in FIG. 3, the silicon carbide MOSFET 100 is formed on an SiC substrate 1 that contains a relatively high concentration ($n^+$) of n-type (first conductivity type) impurities.

On the front main surface (first main surface) of the SiC substrate 1, a drift layer 2 (semiconductor layer) is formed, which is a semiconductor layer that contains a relatively low concentration ($n^-$) of n-type impurities. The drift layer 2 may be an epitaxial growth layer formed by epitaxial growth.

In the upper layer portion of the drift layer 2, a plurality of well regions 4 (first semiconductor regions) that contain p-type (second conductivity type) impurities are selectively formed, and in the upper layer portion of each well region 4, the contact region 5 that contains a relatively high concentration ($p^+$) of p-type impurities is selectively formed. Then, the $n^+$ source region 3 (second semiconductor region) is formed so as to surround the contact region 5. Note that the source region 3 is also referred to as a current output region.

As described with reference to FIG. 2, the source regions 3 and the well regions 4 are formed so as to surround the contact regions 5 concentrically in plan view, and the depth of the well regions 4 from the outermost surface of the drift layer 2 is made deeper than the depths of the source regions 3 and the contact regions 5 from the outermost surface of the drift layer 2.

In the cell arrangement region 20, a gate oxide film 6 (gate insulation film) is formed on the drift layer 2, and the gate electrode 7 is formed on the gate oxide film 6. In the region where the gate pad 21 is formed, the silicon oxide film 14 whose thickness is approximately 1 μm and greater than the thickness of the gate oxide film 6 is formed on the drift layer 2, and the gate electrode 7 is formed of a polycrystalline silicon film that contains phosphorus (P), extending from above the gate oxide film 6 to above the silicon oxide film 14. That is, a space between the edge portions on the upper surface side of each two adjacent well regions 4 makes a junction field effect transistor (JFET) region 16, and the gate electrode 7 is formed on the gate oxide film 6 extending from above the JFET regions 16 to above the edge portions of the well regions 4. In the region extending from the gate pad 21 to the cell arrangement region 20, the gate electrode 7 is formed on the silicon oxide film 14 and on the gate oxide film 6. Note that the silicon oxide film 14 is also provided in the region where the gate line 71 (FIG. 1) is formed, and all the gate electrodes 7 are electrically connected to one another via the gate line 71.

The gate oxide film 6 is formed so as to cover almost the entire main surface of the drift layer 2 in the cell arrangement region 20, but is not provided on the contact regions 5 and part of the source regions 3 surrounding the contact regions 5, on which the silicide film 17 is formed. In the region where the gate pad 21 is formed, the silicon oxide film 14 is provided, instead of the gate oxide film 6, and therefore the gate oxide film 6 and the silicon oxide film 14 may collectively be referred to as an "insulation film." The contact regions 5 are provided so as to reduce contact resistance, but they are not an absolute necessity.

Then, an interlayer insulation film 8 is formed so as to cover all the gate electrodes 7. In the cell arrangement region 20, the source contact holes 12 are provided through the interlayer insulation film 8 to reach the silicide film 17, whereas in the region where the gate pad 21 is formed, the gate contact holes 13 are formed through the interlayer insulation film 8 to reach the gate electrode 7.

Then, in the cell arrangement region 20, the external output source electrode 10 is formed on the interlayer insulation film K and embedded in the source contact holes 12, whereas in the region where the gate pad 21 is formed, the external output gate electrode 15 is formed on the interlayer insulation film 8 and embedded in the gate contact holes 13.

A resin film 70 is provided between the external output source electrode 10 and the external output gate electrode 15 so as to provide electrical isolation between the external output source electrode 10 and the external output gate electrode 15.

On the rear main surface of the SiC substrate 1 (second main surface on the side opposite to the side where the drift layer 2 is provided), a drain electrode 9 (second main electrode) having a laminated structure of a metal film and a metal silicide film is formed. For the sake of convenience, the drain electrode 9 is illustrated as a single-layer structure in FIG. 3. In Embodiment 1 of the present invention, the metal film of the drain electrode 9 is a nickel (Ni) film, and the metal silicide film of the drain electrode 9 is an NiSi$_2$ film. Then, an external output drain electrode 11 having a laminated structure of, for example, an Ni film and a gold (Au) film is formed on the drain electrode 9. For the sake of convenience, the external output drain electrode 11 is illustrated as a single-layer structure in FIG. 3.

The external output source electrode 10 is configured by underlying electrode films 51a and 52a, a Cu film 53a, and a stress relaxation layer 54. That is, the underlying electrode film 52a is provided on the interlayer insulation film 8 along the edge portion of the cell arrangement region 20, and the underlying electrode film 51a is provided on the interlayer insulation film 8 in the remaining portion of the cell arrangement region 20 surrounded by the underlying electrode film 52a. The inner walls of the source contact holes 12 are covered with the underlying electrode film 51a. Then, the stress relaxation layer 54 is provided on the underlying electrode film 52a, and the Cu film 53a is provided so as to cover the entire cell arrangement region 20 including the stress relaxation layer 54.

The stress relaxation layer 54 is provided in order to relax the stress applied to the Cu film 53a and is capable of preventing the occurrence of cracks in the silicon oxide film 14 due to that stress. In the case of a conventional structure in which the stress relaxation layer 54 is not provided, cracks occur in a region indicated by C in FIG. 3.

Meanwhile, the external output gate electrode 15 is configured by an underlying electrode film 51b and a Cu film 53b. That is, the underlying electrode film 51b is provided on the interlayer insulation film 8 throughout the region where the gate pad 21 is formed, so that the inner walls of the gate contact holes 13 are covered with the underlying electrode film 51b. On the underlying electrode film 51b, the Cu film 53b is provided so as to cover the entire region where the gate pad 21 is formed. In Embodiment 1 of the present invention, the Cu films 53a and 53b have a film thickness of 20 μm.

In the case where no voltage is applied to the gate electrodes 7, no channels are formed in the well regions 4 that are directly below the gate electrodes 7, even if a high voltage is applied between the external output source electrode 10 and the external output drain electrode 11. That is, in this voltage application situation, the silicon carbide MOSFET 100 is in its OFF state in which there is no flow of electrons. In contrast, if a high voltage is applied between the external output source electrode 10 and the external output drain electrode 11 and a positive voltage is applied to the gate electrodes 7, channels are formed on the upper side of the well regions 4, and electrons flow along paths from the source regions 3 through the channel regions (regions of the well regions 4 that are directly below the gate electrodes 7), the JFET regions 16, the drift layer 2, the SiC substrate 1, and the drain electrode 9. That is, in this current application situation, the silicon carbide MOSFET 100 is in its ON state in which electrons flow from the external output source electrode 10 toward the drain electrode 9. In this way, on-off control of current is possible with the gate voltage applied to the gate electrodes 7

Manufacturing Method

Next, a method of manufacturing the silicon carbide MOSFET 100 will be described with reference to FIGS. 4 to 15, which are sectional views illustrating manufacturing steps in orderly sequence.

First, the n-type drift layer 2 is epitaxially grown on one main surface (front main surface) of the SiC substrate 1 by chemical vapor deposition (CVD) as illustrated in FIG. 4. Note that the drift layer 2 is a silicon carbide semiconductor layer.

The SiC substrate 1 has a thickness of 50 to 500 μm and contains n-type impurities in concentrations ranging from $1\times10^{19}$ to $1\times10^{21}$ cm$^{-3}$. The drift layer 2 has a thickness of 1 to 60 µm and contains n-type impurities in concentrations ranging from $1\times10^{15}$ to $1\times10$ cm$^{-3}$. Note that the thickness of the drift layer 2 is determined by breakdown voltage required for the silicon carbide MOSFET 100.

On this drift layer 2, a resist mask (not shown) that has openings in order to expose regions that later become the well regions 4 is formed using a photolithographic technique (photolithography). This resist mask is used as an impurity doping inhibiting mask.

After the resist mask has been formed, p-type impurity ions are implanted from above the resist mask to selectively form the well regions 4 in the upper layer portion of the drift layer 2 in the cell arrangement region 20. Here, the well regions 4 have a thickness of 0.5 to 2.0 µm, and the p-type impurities may be Al whose impurity concentrations are set in the range of $1\times10^{17}$ to $5\times10^{17}$ cm$^{-3}$.

Then, the resist mask is removed, and a new resist mask (not shown) that has openings in order to expose regions that later become the source regions 3 is formed using a photolithographic technique. This resist mask is also used as an impurity doping inhibiting mask.

After the resist mask has been formed, n-type impurity ions are implanted from above the resist mask to form the source regions 3 in the upper layer portions of the well regions 4. Here, the source regions 3 have a thickness of 0.5 to 2.0 µm, and the n-type impurities may be nitrogen (N) whose concentrations are set in the range of $1\times10^{18}$ to $1\times10^{21}$ cm$^{-3}$.

Then, the resist mask is removed, and a new resist mask (not shown) that has openings in order to expose regions that later become the contact regions 5 is formed using a photolithographic technique. This resist mask is also used as an impurity doping inhibiting mask.

After the resist mask has been formed, p-type impurity ions are implanted from above the resist mask to form the contact regions 5 in the central portions of the source regions 3. Here, the contact regions 5 have a thickness of 0.2 to 0.5 µm, and the p-type impurities may be Al whose impurity concentrations are set in the range of $1\times10^{8}$ to $1\times10^{21}$ cm$^{-3}$.

Then, the resist mask is removed, and high-temperature annealing is performed at a temperature of 1500° C. or higher in order to activate the doped n- and p-type impurities.

Next, for example, an oxide film (SiO$_2$) is formed on the drift layer 2 by CVD. Thereafter, an etching mask that has openings in order to expose the cell arrangement region 20 is formed using a photolithographic technique, and this etching mask is used to remove the oxide film in the cell arrangement region 20 by etching. In this way, the silicon oxide film 14 is formed on the drift layer 2 in the region where the gate pad 21 is formed, as illustrated in FIG. 4. The thickness of the silicon oxide film 14 is set in the range of 0.5 to 2 µm, and in Embodiment 1 of the present invention, the silicon oxide film 14 has a thickness of 1 µm.

Thereafter, in the step illustrated in FIG. 5, the SiC substrate 1 (including the upper configuration) is exposed to an atmosphere containing oxygen and water vapor and having a temperature of approximately 1000° C., so that the surface of the cell arrangement region 20 is thermally oxidized to form the gate oxide film 6 of a thermal oxide film (SiO$_2$). The gate oxide film 6 has a thickness of, for example, 50 nm.

This step of forming the gate oxide film 6 and the silicon oxide film 14 is referred to as the step of forming an "insulation film" on the upper surface of the cell arrangement region 20 and the region where the gate pad 21 is formed.

Although the above gate oxide film 6 is described as a thermal oxide film, the gate oxide film 6 may be an oxide film formed by CVD, or may be a laminated film of a thermal oxide film and an oxide film formed by CVD. Also, the surface of the gate oxide film 6 may be subjected to nitriding. Nitriding may be implemented by annealing the SiC substrate 1 at a high temperature such as 1000° C. or higher in a nitrogen monoxide (NO) or dinitrogen monoxide (N$_2$O) gas after the gate oxide film 6 is formed.

Next, a polycrystalline silicon film that contains phosphorus (P) in concentrations ranging from $1\times10^{19}$ to $1\times10^{21}$ cm$^{-3}$ is formed on the insulation film by CVD to form the gate electrodes 7. The thickness of the gate electrodes 7 is set in the range of 300 to 600 nm, and in Embodiment 1 of the present invention, the gate electrodes 7 have a thickness of 500 nm. Note that the gate electrodes 7 may be formed of p-type polycrystalline silicon containing boron (B).

Next, an etching mask that has openings in order to expose the gate electrodes 7 above the source regions 3 and the contact regions 5 is formed using a photolithographic technique, and this etching mask is used to remove the gate electrodes 7 exposed to the openings by etching. In this way, the gate electrodes 7 are removed from above the source regions 3 and the contact regions 5, whereas the gate electrodes 7 above the well regions 4, the JFET regions 16, and the region where the gate pad 21 is formed remain via the insulation film, as illustrated in FIG. 6.

Next, a silicon oxide film having a thickness of 1 µm is formed by, for example, CVD on the entire surface of the SiC substrate 1 (including the upper configuration), which makes the interlayer insulation film 8. Then, an etching mask that has openings in order to expose the interlayer insulation film 8 above the contact regions 5 and the source regions 3 surrounding the contact regions 5 in the cell arrangement region 20 is formed using a photolithographic technique, and this etching mask is used to remove the interlayer insulation film 8 exposed to the openings by etching and also remove the gate oxide film 6 under that interlayer insulation film 8 to form the source contact holes 12 illustrated in FIG. 7.

This etching may be either wet etching or dry etching, or may be a combination of wet etching and dry etching. The wet etching uses a buffered hydrogen fluoride (BHF) solution obtained by mixing HF and NH$_4$F. The dry etching uses reactive ion etching (RIE). In this case, trifluoromethane (CHF$_3$) and oxygen (O$_2$) are used as etching gases. This dry etching is anisotropic etching. Note that the etching gas is not limited to CHF$_3$, and perfluoropropane (C$_3$F$_8$) may be used as an etching gas.

As a result of this etching, part of the source regions 3 and the contact regions 5 are exposed to the bottoms of the source contact holes 12.

After the etching mask is removed, in the step illustrated in FIG. 8, an Ni film ML having a thickness of approximately 50 nm is formed on the entire surface of the SiC substrate 1 (including the upper configuration) by, for example, sputtering, and then the SiC substrate 1 is subjected to annealing (first annealing). In this way, a metal silicide film (here, an NiSi$_2$ film) is formed on the source regions 3 and the contact regions 5 that are exposed to the bottoms of the source contact holes 12.

The annealing as used herein refers to heating the SiC substrate 1 at a temperature of 300 to 800° C. for one to three minutes by rapid thermal annealing (RTA). The heating at this temperature causes a reaction between Ni of the Ni film and SiC forming the contact regions 5 and the source regions 3 that are in contact with the Ni film, thus forming the silicide film 17. Note that the Ni film that is not in contact with SiC does not react with SiC and thus remains intact as Ni.

Figure 9:
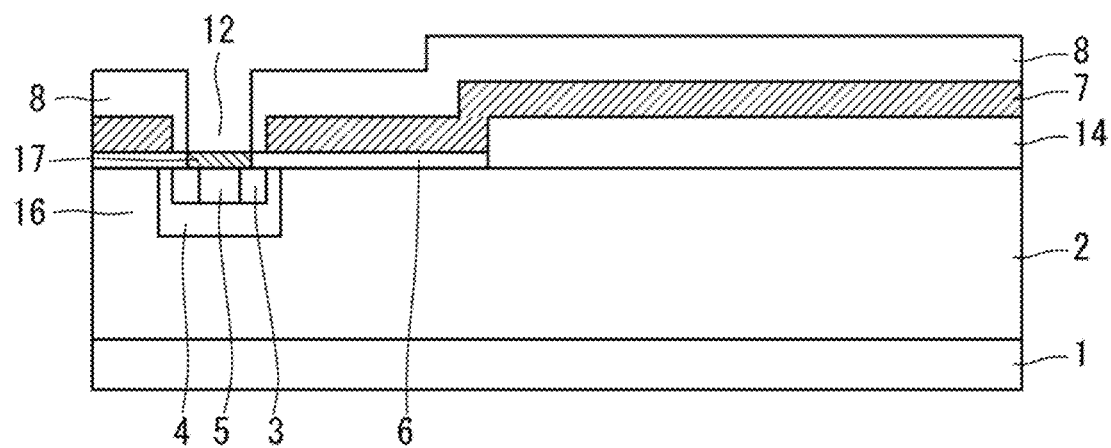

After the silicide film 17 has been formed, for example, the SiC substrate 1 is cleaned with an acidic solution containing either sulfuric acid or hydrochloric acid. This cleaning removes the Ni film that has been unreacted in the silicidation reaction. By removing the unreacted Ni film, the configuration illustrated in FIG. 9 is obtained.

Next, an etching mask that has a plurality of openings in order to expose the interlayer insulation film 8 on the gate electrode 7 in the region where the gate pad 21 is formed is formed using a photolithographic technique, and this etching mask is used to remove the interlayer insulation film 8 exposed to the plurality of openings by etching and to form the gate contact holes 13. This etching may use the same method as used in the etching of the source contact holes 12.

As a result of this etching, the gate electrode 7 is exposed to the bottoms of the gate contact holes 13 as illustrated in FIG. 10.

Thereafter, in the step illustrated in FIG. 10, the drain electrode 9 is formed on the rear surface of the SiC substrate 1. The method of forming the drain electrode 9 will be described hereinafter.

First, an Ni film having a thickness of 300 nm is formed on the rear surface of the SiC substrate 1 by sputtering. Next, this Ni film is subjected to heat treatment so as to be silicided. For example, the SiC substrate 1 is subjected to annealing (second annealing) at a temperature of 1000° C. by RTA. The second annealing is performed at a temperature higher than the temperature (300 to 800° C.) of the first annealing, and the Ni film is heated for 30 seconds. This further reduces the contact resistance of the silicide film 17 inside the source contact holes 12. Moreover, the Ni film formed on the rear surface of the SiC substrate 1 reacts with the rear surface of the SiC substrate 1, thereby forming an $NiSi_2$ film at the same time. This also achieves a low-resistance ohmic contact between the $NiSi_2$ film and the SiC substrate 1. Note that since the thickness of the Ni film is 300 nm and large, the whole of the Ni film in the thickness direction does not become the $NiSi_2$ film. In this way, the drain electrode 9 having a laminated structure of the Ni film and the $NiSi_2$ film is formed on the rear surface of the SiC substrate 1 as illustrated in FIG. 10.

Next, an underlying electrode film 51 is formed on the source contact holes 12, the gate contact holes 13, and the interlayer insulation film 8 in the step illustrated in FIG. 11. The underlying electrode film 51 has a laminated structure in which a Ti film exists on the side in contact with the silicide film 17 and a Cu film is laminated on the Ti film.

The Ti film has a film thickness of 30 to 100 nm and formed by, for example, sputtering. The Cu film has a film thickness of 100 to 500 nm and formed by, for example, sputtering. The Cu film forming the underlying electrode film 51 becomes a seed film of a Cu film, which will be described later. Note that the underlying electrode film 51 is not limited to a laminated film of Ti and Cu. The underlying electrode film 51 may be a laminated film of Ti, TiN, and Cu in order from the side in contact with the silicide film 17, a laminated from of TiN and Cu in order from the same side, a laminated film of Ti, Al, and Cu in order from the same side, a laminated film of Ti, TiN, Al, and Cu in order from the same side, a laminated film of Ti, Al, Ni, and Cu in order from the same side, or a laminated film of Ti, TiN, Al, Ni, and Cu in order from the same side. TiN functions as a barrier metal. Other materials such as Ta, W, WN, and TiW may also be used as a barrier metal. The method of forming the underlying electrode film 51 is not limited to sputtering, and may be other methods such as vapor deposition or CVD.

Figures 12, 13:
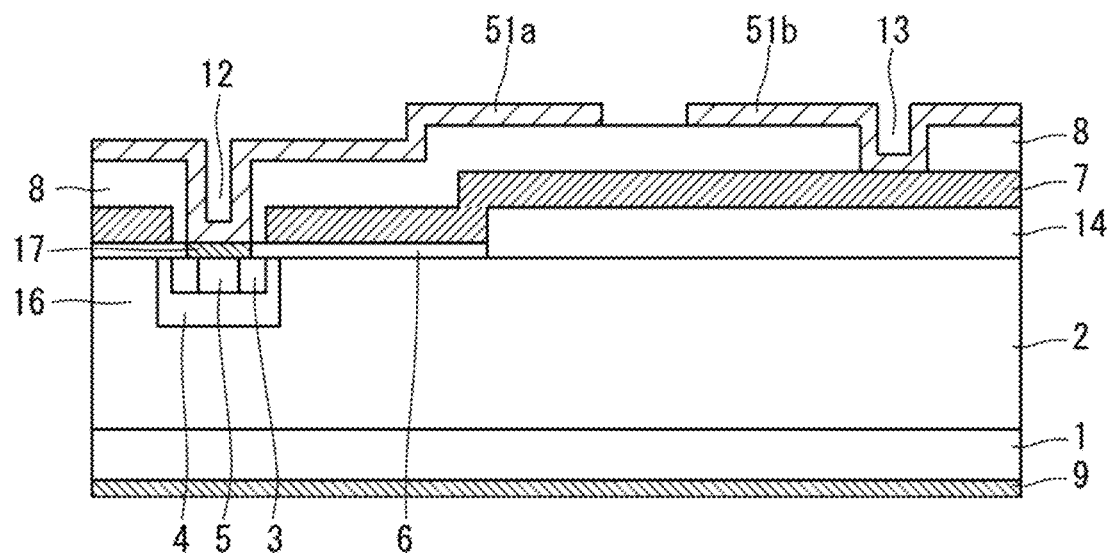

Then, the underlying electrode film 51 is patterned by photolithography and etching to form the underlying electrode film 51 in the cell arrangement region 20 and to form the underlying electrode film 51*b* in the region where the gate pad 21 is formed, as illustrated in FIG. 12.

Thereafter, in the step illustrated in FIG. 13, a resist 75 that has an opening OP1 running along the edge portion of the underlying electrode film 51*a* is formed by photolithography. Although the underlying electrode film 51*a* is exposed to the bottom of the opening OP1 of the resist 75, the width of the exposed underlying electrode film 51*a* may be set in the range of 0.1 to 1.0 mm by the setting of the opening OP1.

Then, asperities are formed on the surface of the underlying electrode film 51*a* that is exposed to the bottom of the opening OP1. The asperities are formed so as to have a width less than or equal to 1 μm and a height of 10 to 100 nm in a planar direction. By forming asperities on the surface of the exposed underlying electrode film 51*a*, the underlying electrode film 52*a* as illustrated in FIG. 13 is obtained. Note that the asperities are so minute and therefore not shown in FIG. 13.

In Embodiment 1 of the present invention, the asperities are formed by irradiating the surface of the underlying electrode film 52*a* with argon (Ar) ions. More specifically, an Ar gas is introduced into a vacuum container that houses the SiC substrate 1 in the stage where the resist 75 has been formed, and Ar ions are generated by creating a high electric field by the application of a high voltage between the SiC substrate 1 and a predetermined electrode. Then, the SiC substrate 1 is irradiated with the Ar ions under the high electric field so as to form asperities on the surface of the exposed underlying electrode film 51*a*, which produces the underlying electrode film 52*a*. Note that the pressure of the Ar gas is 10 Pa, the applied voltage is 1 kV, and the input power is 800 W.

Next, the resist 75 is removed, and a resist 76 is formed between the underlying electrode film 52*a* and the underlying electrode film 51*b* by photolithography as illustrated in FIG. 14. The resist 76 is formed so as to cover part of the underlying electrode film 52*a* and part of the underlying electrode film 51*b*, and is formed along the edge portion of the underlying electrode film 52*a*. Thus, the resist 76 is also formed in the region where the underlying electrode film 52*a* faces the gate line 71 (FIG. 1).

Next, a Cu film is formed in the step illustrated in FIG. 15. The Cu film may be formed by an ordinary electroplating method. Assume that the plating solution is copper sulfate, the positive electrode is copper, and the current density is in the range of 0.03 to 0.06 $A/cm^2$. By electroplating, the Cu films 53*a* and 53*b* having a thickness of 20 μm are formed respectively in the cell arrangement region 20 and the region where the gate pad 21 is formed. At this time, the Cu films 53*a* and 53*b* whose grain sizes are approximately 10 μm are formed respectively on the underlying electrode films 51*a* and 51*b* that have no surface asperities. On the other hand, a Cu film 54 whose grain size is less than or equal to 1 μm is formed on the underlying electrode film 52*a* that has surface asperities. The Cu film 54 has a film thickness of approximately 5 μm. This Cu film 54 having a small grain size functions as a stress relaxation layer and thus may be referred to as the "stress relaxation layer 54."

Note that the Cu films 53*a*, 53*b*, and 54 formed by electroplating grow on only the underlying electrode films 51*a*, 51*b*, and 52*a*.

After the Cu films 53a, 53b, and 54 have been formed, a resin film is formed on the SiC substrate 1 in the stage where the resist 76 has been removed, and the resist film is patterned by photolithography and etching such that the resin film 70 is embedded in the opening formed by the removal of the resist 76. The resin film may be polyimide, which is an organic resin. The film thickness of the resin film is set slightly greater than the film thickness of the Cu films 53a and 53b, so that the resin film 70 covers the gate line 71 in the region where the gate line 71 is formed. Through the steps described above, the process of manufacturing the front main surface of the SiC substrate 1 is completed.

Thereafter, the external output drain electrode 11 is formed on the drain electrode 9 by, for example, sputtering. The external output drain electrode 11 may be a laminated film of an Au film having a film thickness of 150 nm and either a gold (Au) film having a film thickness of 150 nm or an Ni film having a film thickness of 500 nm. Through the step described above, the silicon carbide MOSFET 100 illustrated in FIG. 3 is completed.

After a Cu wire (not shown) is joined to the Cu films 53a and 53b by wire bonding, the MOSFET is sealed with, for example, a resin. This completes a planar gate type MOSFET module.

As described above, in the silicon carbide MOSFET 100, the underlying electrode film 52a is provided on the interlayer insulation film 8 along the edge portion of the cell arrangement region 20, and the stress relaxation layer 54 is formed thereon. This configuration relaxes the stress of the Cu film 53a even if the Cu film 53a has a large thickness, e.g., 20 μm, and thus prevents the occurrence of cracks in the vicinity of the junction between the silicon oxide film 14 and the gate oxide film 6. Since cracks starts to occur if the thickness of the Cu film 53a exceeds 10 μm, the present invention is effective for semiconductor devices that include Cu films having thicknesses exceeding 10 μm, and more practically effective for semiconductor devices that include Cu films having thicknesses of 15 to 30 μm.

Note that the short circuit current capability can be improved by setting the thickness of the Cu film 53a greater than or equal to 15 μm.

Also, the resistance of the external output source electrode 10 does not increase because the stress relaxation layer 54 is formed of the Cu film having a small grain size.

Moreover, the Cu film 54 (stress relaxation layer 54) having a small grain size is formed in a self-alignment manner when the Cu film is formed by ordinary electroplating on the underlying electrode film 52a whose surface asperities are generated by irradiation with Ar ions. This suppresses an increase in the number of manufacturing steps in order to form the stress relaxation layer 54 and suppresses an increase in the cost of manufacture.

Reason why Occurrence of Cracks is Suppressed

The following description is given on the reason why the Cu film 54 having a small grain size (whose grain size is less than or equal to 1 μm) is formed on the underlying electrode film 52a having surface asperities. Description is also given on the reason why the Cu film 54 (stress relaxation layer 54) having a small grain size is able to prevent the occurrence of cracks in the silicon oxide film 14.

A Cu film formed by electroplating grows on only a Cu film. The uppermost layers of the underlying electrode films 51a, 51b, and 52a, which are laminated films, are Cu films and function as seed films.

Here, the Cu film serving as the uppermost layer of the underlying electrode film 51a has a flat surface, whereas the Cu film serving as the uppermost layer of the underlying electrode film 52a has asperities having widths less than or equal to 1 μm and heights of 10 to 100 nm in a planar direction. If these Cu films are subjected to electroplating to grow Cu films, it is possible to grow Cu films with different crystal grains depending on the asperities.

Since the asperities have widths less than or equal to 1 μm in a planar direction, the grain size of the Cu film that grows on the underlying electrode film 52a does not become larger than or equal to 1 μm. As a result, the Cu film 54 whose grain size is 1 μm or less is formed in an self-alignment manner on the underlying electrode film 52a having surface asperities. Also, the grown crystal grains have columnar shapes and heights of approximately 5 μm. That is, a columnar crystal having a lateral width less than or equal to 1 μm and a height of approximately 5 μm grows into the Cu film 54

Note that the height of the columnar crystal increases if the growth rate of the Cu film by electroplating is reduced. This is because it takes time to inherit the crystallinity of crystal grains thereunder during growth. In electroplating, the growth rate of the Cu film can be reduced by reducing either the current density or the temperature of the plating solution, so that the height of the columnar crystal can be adjusted by adjusting the growth rate of the Cu film.

Note that the grain size of the Cu film 54 is approximately in the range of 0.1 to 1 μm, and the grain sizes of the Cu films 53a and 53b are approximately in the range of 3 to 15 μm.

The Cu film 54 having a small grain size contains a large number of grain boundaries. The grain boundaries disperse the stress generated inside the thick Cu film 53a. This prevents stress concentration in the edge portion of the external output source electrode 10 and prevents the occurrence of cracks in the vicinity of the junction between the silicon oxide film 14 and the gate oxide film 6, provided in the edge portion of the external output source electrode 10.

According to the experiments conducted by the inventors, it has been confirmed that a combination of a copper film having a grain size of 0.1 to 1 μm and a thickness of 5 μm and copper films having grain sizes of approximately 10 μm and thicknesses of 15 μm, 20 μm, and 30 μm, respectively, prevents the occurrence of cracks.

Embodiment 2

Device Configuration

Although the silicon carbide MOSFET 100 according to Embodiment 1 described above illustrate a configuration in which the stress relaxation layer 54 is provided in the edge portion of the external output source electrode 10, the position where the stress relaxation layer 54 is disposed is not limited to this edge portion.

Figure 16:
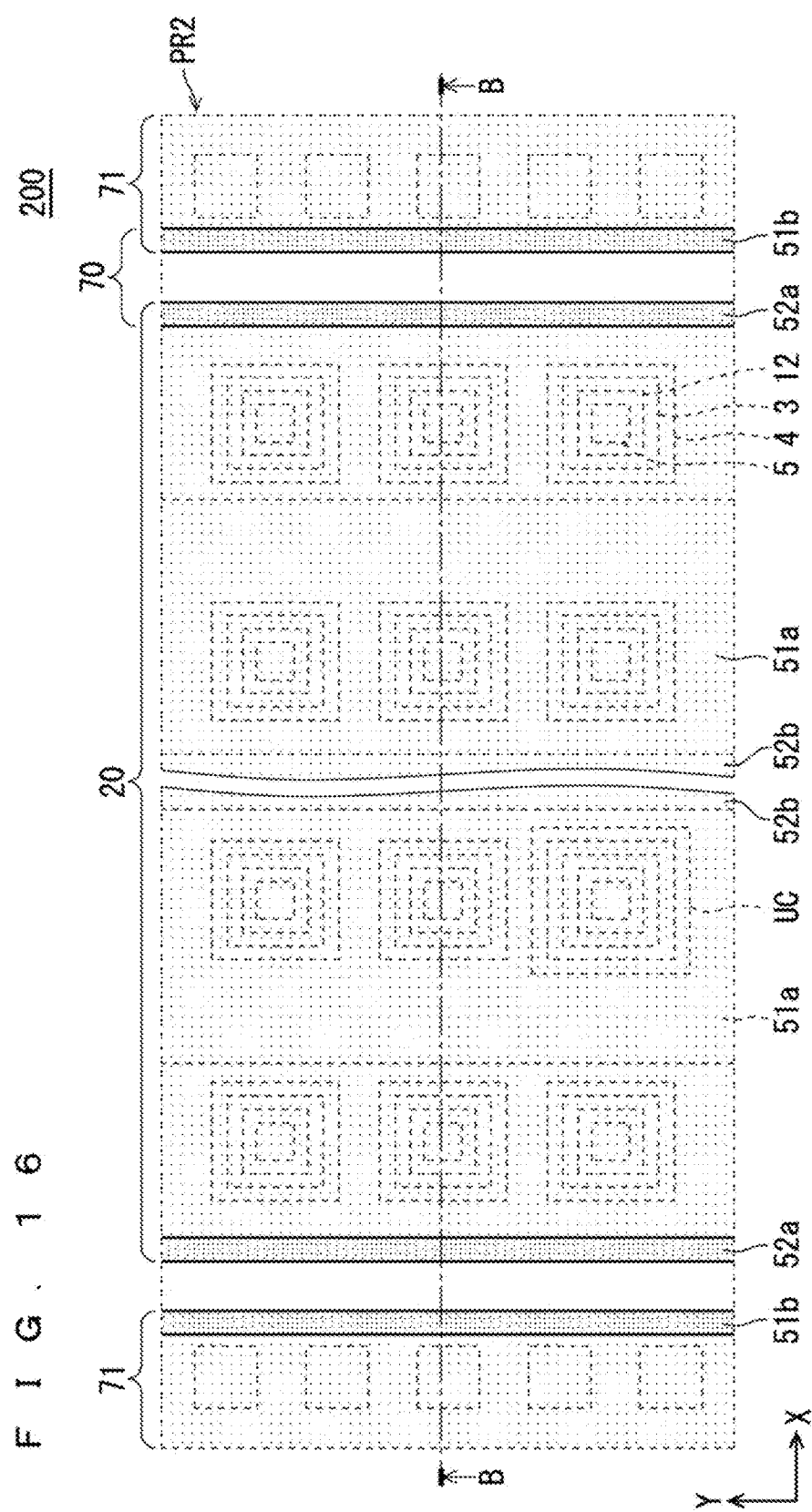
FIG. 16 is a plan view schematically illustrating each impurity region formed in a main surface of a silicon carbide semiconductor device according to Embodiment 2 of the present invention.

FIG. 16 is a partial plan view of a planar gate type silicon carbide MOSFET 200 according to Embodiment 2 of the present invention, and schematically illustrates a configuration of a region PR2 illustrated in FIG. 1. As illustrated in FIG. 16, in the silicon carbide MOSFET 200, stripe-like underlying electrode films 52b having surface asperities are provided in portions other than the edge portion of the cell arrangement region 20, in addition to the underlying electrode film 52a provided in the edge portion of the cell arrangement region 20.

That is, the stripe-like underlying electrode films 52b are provided along the longitudinal (Y-direction) arrangements of unit cells UC between the units cells UC arranged in the horizontal direction (X direction). On the stripe-like underlying electrode films 52b, stripe-like stress relaxation layers 54b are formed in a self-alignment manner, but not shown.

The stress relaxation layers 54b have a width of 5 μm and are formed at an interval of 30 μm.

Figure 17:
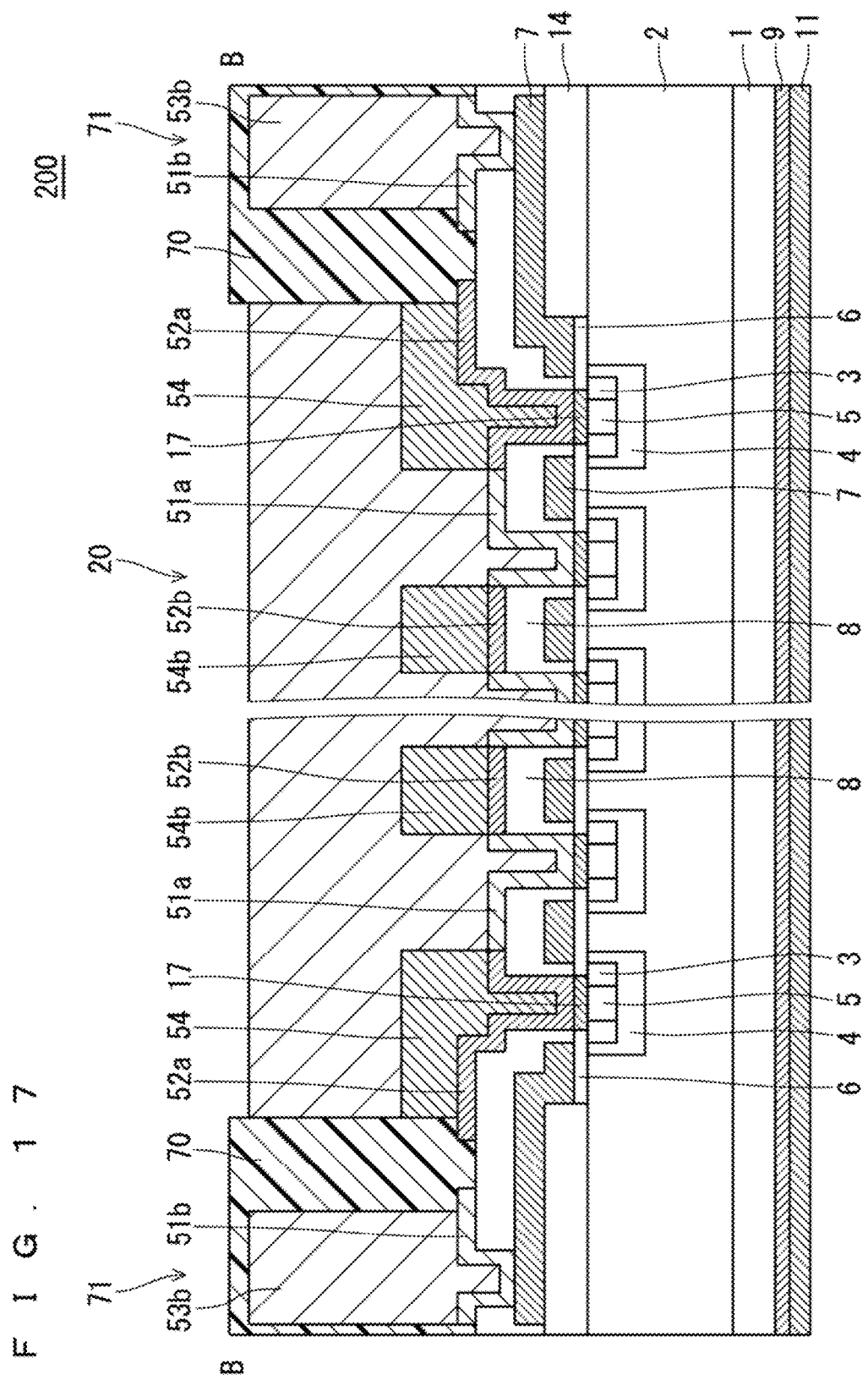
FIG. 17 is a sectional view of the silicon carbide semiconductor device according to Embodiment 2 of the present invention.

Next, a sectional configuration taken along line B-B in FIG. 16 will be described with reference to the sectional view in FIG. 17. As illustrated in FIG. 17, the sectional configuration of the silicon carbide MOSFET 200 is basically identical to the sectional configuration of the silicon carbide MOSFET 100 illustrated in FIG. 3, but differs in that in the cell arrangement region 20, the underlying electrode film 52a is provided from the edge portion of the cell arrangement region 20 to above the unit cells UC that are proximate to the edge portion. That is, the underlying electrode film 52a covers the inner surfaces of the source contact holes 12 of the unit cells UC proximate to the edge portion of the cell arrangement region 20. The inner surfaces of the source contact holes 12 of the other unit cells UC, except the unit cells UC proximate to the edge portion of the cell arrangement region 20, are covered with the underlying electrode film 51a.

Also, the underlying electrode films 52b are formed via the interlayer insulation film 8 on the gate electrodes 7 formed between the unit cells UC arranged in the horizontal direction.

Accordingly, the stress relaxation layer 54 is formed on the underlying electrode film 52a, which is provided extending from the edge portion of the cell arrangement region 20 to above the unit cells UC proximate to the edge portion, whereas the stress relaxation layers 54b are formed on the underlying electrode films 52b provided above the gate electrodes 7 formed between the unit cells CC arranged in the horizontal direction.

In this way, the stripe-like underlying electrode films 52b are provided in the portions other than the edge portion of the cell arrangement region 20, and the stripe-like stress relaxation layers 54b are formed in a self-alignment manner on the underlying electrode films 52b. This configuration further reduces the stress generated inside the Cu film 53a. This configuration is effective at reducing the stress of the Cu film 53a for the case where the thickness of the Cu film 53a is set greater than or equal to 20 μm, e.g., 30 μm, and the case where the chip size is large, i.e., the Cu film 53a has a large width. Note that the effect of preventing the occurrence of cracks in the interlayer insulation film 8 is increased by providing the underlying electrode films 52b in the portions other than the edge portion of the cell arrangement region 20.

The method of forming the stress relaxation layers 54 and 54b is the same as the method described in Embodiment 1. This suppresses an increase in the number of manufacturing steps in order to form the stress relaxation layers 54 and 54b and suppresses an increase in the cost of manufacture.

Manufacturing Method

Next, a method of manufacturing the silicon carbide MOSFET 200 will be described with reference to FIGS. 18 to 20, which are sectional views illustrating manufacturing steps in orderly sequence.

Figure 18:
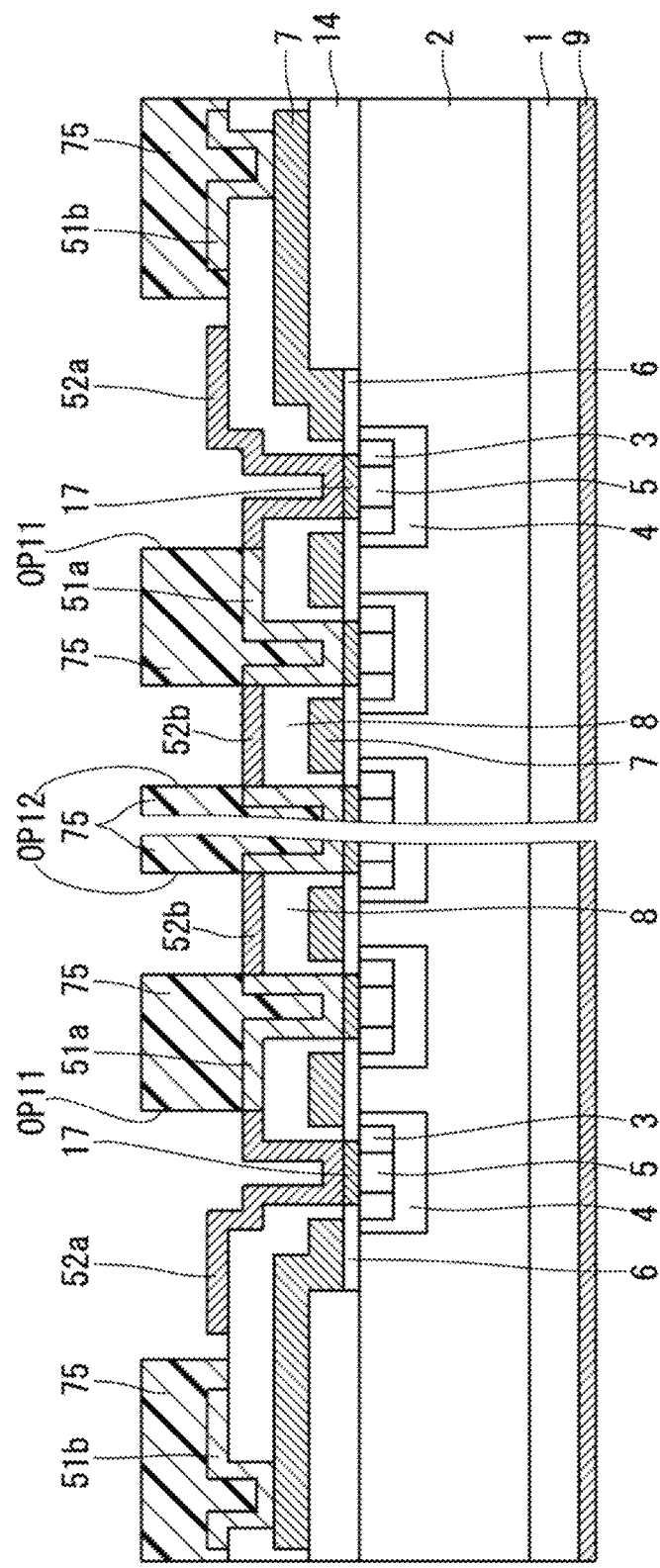
FIGS. 18 to 20 are sectional views for describing a step of manufacturing the silicon carbide semiconductor device according to Embodiment 2 of the present invention.

Note that the steps that lead to the configuration in FIG. 18 are identical to those described with reference to FIGS. 4 to 12, and therefore description thereof has been omitted.

After the underlying electrode film 51a has been formed in the cell arrangement region 20 and the underlying electrode films 51b have been formed in the regions where the gate pad 21 and the gate line 71 are formed through the steps described with reference to FIGS. 4 to 12, a resist 75 that has an opening OP11 and a stripe-like opening OP12 is formed by photolithography in the step illustrated in FIG. 18, the opening OP11 being formed extending from the edge portion of the underlying electrode film 51a to above the unit cells UC proximate to this edge portion, and the opening OP12 being formed above the gate electrodes 7 formed between the unit cells UC arranged in the horizontal direction. The underlying electrode film 51a is exposed to the bottoms of the openings OP11 and OP12 of the resist 75.

Then, asperities are formed on the surface of the underlying electrode film 51a exposed to the bottoms of the openings OP11 and OP12. The asperities are formed so as to have widths less than or equal to 1 μm and heights of 10 to 100 nm in a planar direction. By forming asperities on the surface of the exposed underlying electrode film 51a, the underlying electrode films 52a and 52b are formed respectively on the bottoms of the openings OP11 and OP12 as illustrated in FIG. 18. Note that the method of forming asperities is the same as that described in Embodiment 1.

Figure 19:
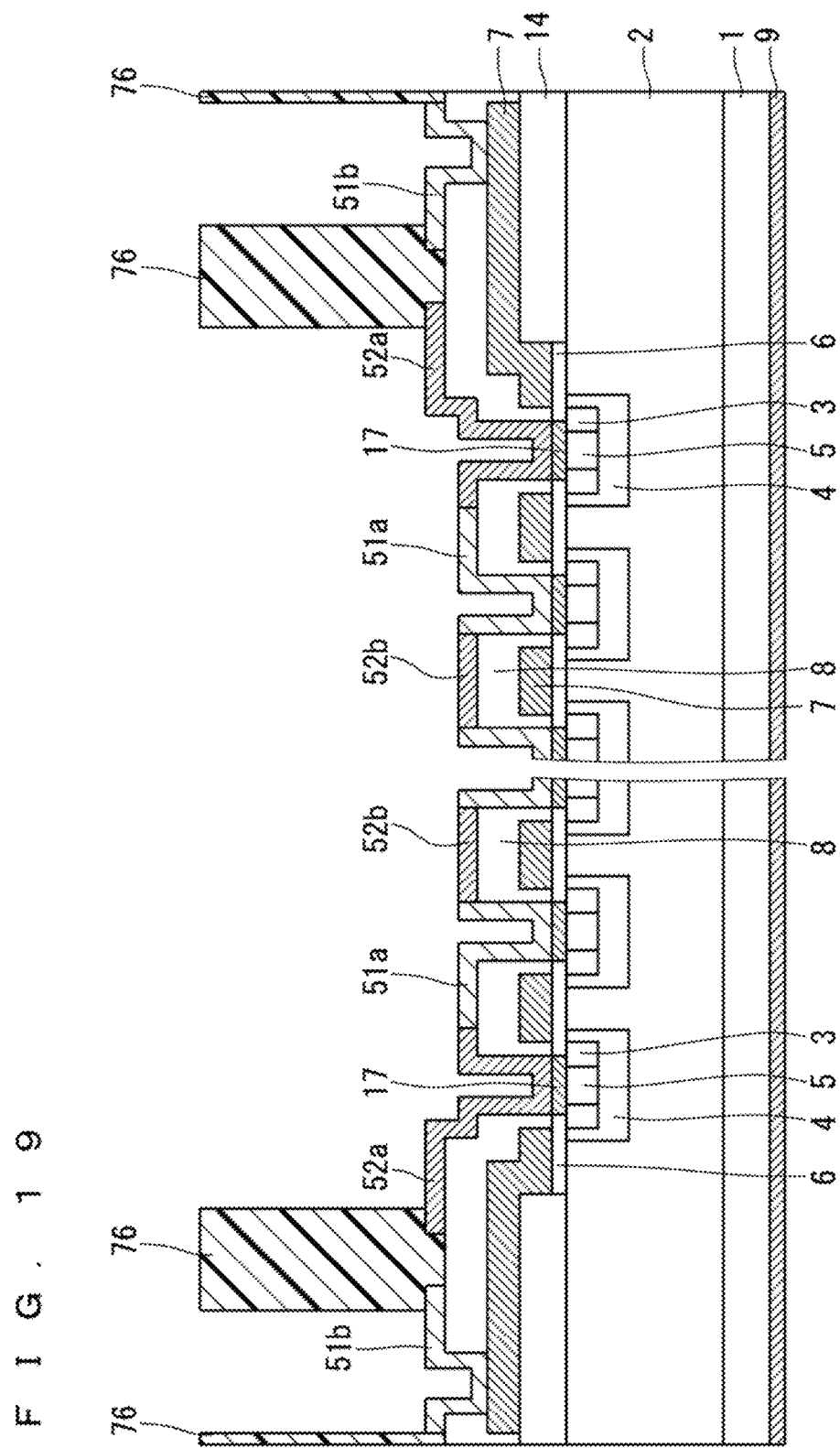

Next, the resist 75 is removed, and a resist 76 is formed between the underlying electrode film 52a and the underlying electrode film 51b by photolithography as illustrated in FIG. 19. The resist 76 is formed to cover part of the underlying electrode film 52a and part of the underlying electrode film 51b, and is also formed along the edge portion of the underlying electrode film 52a. Thus, the resist 76 is also formed in the region where the underlying electrode film 52a faces the gate pad 21 (FIG. 1). In the region where the gate line 71 is formed, the resist 76 is patterned such that an opening is formed above the underlying electrode film 51b.

Figure 20:
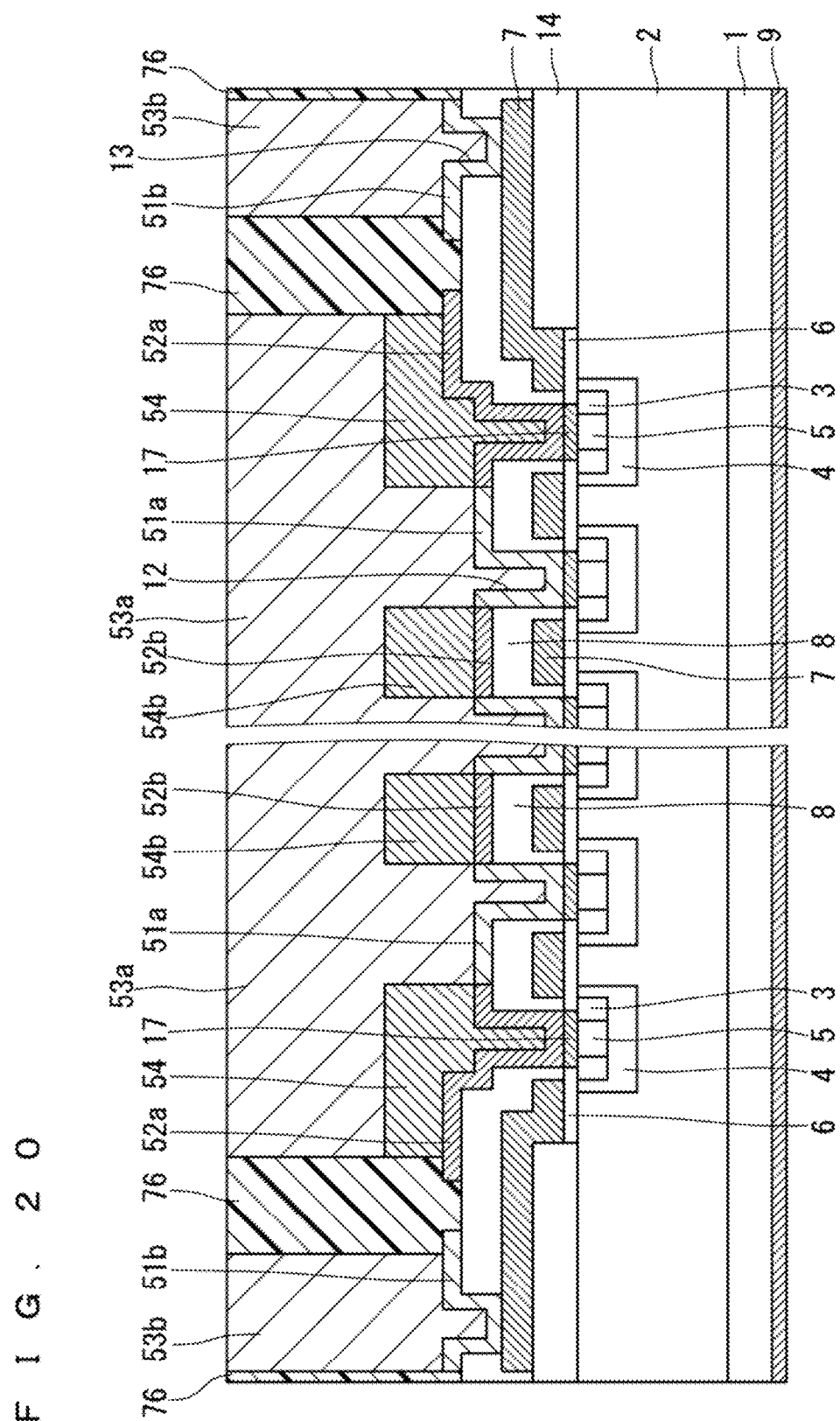

Next, a Cu film is formed in the step illustrated in FIG. 20. The Cu film may be formed by ordinary electroplating as in Embodiment 1. The conditions for electroplating are the same as in Embodiment 1

By electroplating, Cu films 53a and 53b having a thickness of 20 μm are formed respectively in the cell arrangement region 20 and the region where the gate line 71 is formed. At this time, the Cu films 53a and 53b whose grain sizes are approximately 10 μm are formed respectively on the underlying electrode films 51a and 51b that have no surface asperities. On the other hand, Cu films 54 and 54b whose grain sizes are less than or equal to 1 μm are formed respectively on the underlying electrode films 52a and 52b that have surface asperities. The Cu film 54 has a film thickness of sizes are stress relaxation layers and thus may be referred to as "stress relaxation layers 54 and 54b." In the region where the gate pad 21 is formed (FIG. 1), the Cu film 53b is formed on the underlying electrode film 51b.

After the Cu films 53a, 53b, 54, and 54b have been formed, a resist film is formed on the SiC substrate 1 in the stage where the resist 76 has been removed, and this resist film is patterned by photolithography and etching so that the resin film 70 is embedded in the opening formed by the removal of the resist 76. The resin film may be polyimide. The film thickness of the resin film is set slightly greater than the film thickness of the Cu films 53a and 53b, so that the resin film 70 covers the gate line 71 in the region where the gate line 71 is formed. Through the steps described above, the process of manufacturing the front main surface of the SiC substrate 1 is completed.

Thereafter, the external output drain electrode 11 is formed on the drain electrode 9 through the same steps as in Embodiment 1. This completes the silicon carbide MOSFET 200 illustrated in FIG. 17.

Although in the above descriptions, the stress relaxation layers 54b have a width of 5 μm and are formed at an interval of 30 μm, the width and interval of the stress relaxation layers 54b are not limited to this example and may be appropriately adjusted according to the film thicknesses of the Cu films 53a and 53b and the chip size.

Embodiment 3

Application to Trench Gate Type MOSFET

While Embodiments 1 and 2 described above illustrate configurations obtained by applying the present invention to the planar gate type silicon carbide MOSFETs, the present invention is also applicable to trench gate type MOSFETs.

In the planar gate type silicon carbide MOSFETs 100 and 200 described in Embodiments 1 and 2, electrons flow along a path from the source regions 3 through the channel regions (regions of the well regions 4 that are directly below the gate electrodes 7), the JFET regions 16, the drift layer 2, the SiC substrate 1, and the drain electrode 9.

Here, the JFET regions 16 have low impurity concentrations and thus have a high resistance value, thus increasing the on-state resistance of the MOSFETS. In order to reduce this on-state resistance, i.e., to increase the drain current, so-called trench gate type MOSFETs that include no JFET regions 16 have been developed.

Figure 21:
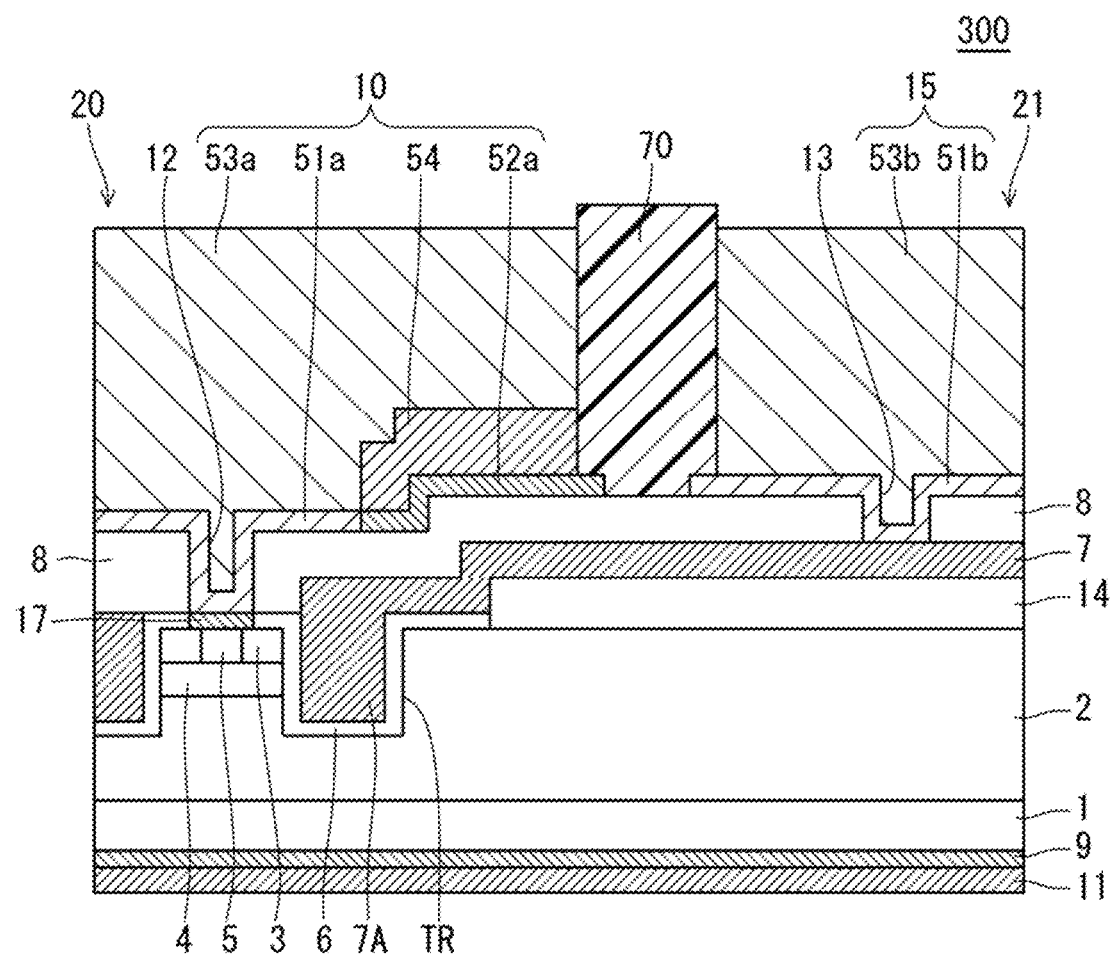
FIG. 21 is a sectional view of a silicon carbide semiconductor device according to Embodiment 3 of the present invention.

FIG. 21 is a sectional view illustrating a configuration of a trench gate type silicon carbide MOSFET 300 according to Embodiment 3 of the present invention. In FIG. 21, constituent elements that are identical to those of the silicon carbide MOSFET 100 described with reference to FIG. 3 are given the same reference numerals, and redundant descriptions thereof have been omitted.

FIG. 21 is a sectional view that corresponds to FIG. 3 described in Embodiment 1, in which a plurality of trenches TR are formed in the upper layer portion of the drift layer 2 so as to extend in the thickness direction of the SiC substrate 1, well regions 4 are provided in the upper layer portion of the drift layer 2 between the plurality of trenches TR, contact regions 5 are selectively provided in the upper layer portions of the well regions 4, and source regions 3 are provided so as to sandwich the contact regions 5. The depth of the well regions 4 from the outermost surface of the drift layer 2 is greater than the depths of the source regions 3 and the contact regions 5 from the outermost surface of the drift layer 2. Note that the contact regions 5, the well regions 4, and the source regions 3 are provided along the trenches TR.

The trenches TR are provided so as to reach a depth that exceeds the deepest portions of the well regions 4, the inner surfaces of the trenches TR are covered with a gate oxide film 6, and gate electrodes 7A are embedded in spaces defined by the gate oxide film 6 in the trenches TR. The gate oxide film 6 is in contact with the side surfaces of the well regions 4 and the source regions 3. Note that the gate electrodes 7A are formed so as to reach a depth that exceeds the deepest portions of the well regions 4.

Although the gate oxide film 6 is provided so as to cover the inner surfaces of the trenches TR and the top of the drift layer 2, the gate oxide film 6 is not provided on top of the contact regions 5 and on part of top of the source regions 3 on both sides of the contact regions 5 because a silicide film 17 is formed thereon. In the region where the gate pad 21 is formed, a silicon oxide film 14 is provided, instead of the gate oxide film 6.

The gate electrodes 7A are embedded in the trenches TR and provided on top of the gate oxide film 6 and the silicon oxide film 14 on the drift layer 2, and an interlayer insulation film 8 is provided so as to cover all the gate electrodes 7A.

Then, in the cell arrangement region 20, source contact holes 12 are provided through the interlayer insulation film 8 so as to reach the silicide film 17, whereas in the region where the gate pad 21 is formed, gate contact holes 13 are provided through the interlayer insulation film 8 to reach the gate electrode 7A.

Then, in the cell arrangement region 20, an external output source electrode 10 is formed on the interlayer insulation film 8 so as to be embedded in the source contact holes 12, whereas in the region where the gate pad 21 is formed, an external output gate electrode 15 is formed on the interlayer insulation film 8 and embedded in the gate contact holes 13.

Also, a resin film 70 is provided between the external output source electrode 10 and the external output gate electrode 15 so as to provide electrical isolation between the external output source electrode 10 and the external output gate electrode 15.

As illustrated in FIG. 21, in the silicon carbide MOSFET 300, the underlying electrode film 52a is provided on the interlayer insulation film 8 along the edge portion of the cell arrangement region 20, and the stress relaxation layer 54 is provided on the underlying electrode film 52a as in the silicon carbide MOSFET 100 illustrated in FIG. 3. Thus, even if the thickness of the Cu film 53a is increased to 20 μm, it is possible to relax the stress of the Cu film 53a and to prevent the occurrence of cracks in the vicinity of the junction between the silicon oxide film 14 and the gate oxide film 6.

Since the stress relaxation layer 54 is formed of the Cu film having a small grain size, the resistance of the external output source electrode 10 does not increase.

The method of forming the stress relaxation layer 54 is the same as that described in Embodiment 1. This suppresses an increase in the number of manufacturing steps in order to form the stress relaxation layer 54 and suppresses an increase in the cost of manufacture.

In the silicon carbide MOSFET 300, regions of the well regions 4 that face the gate electrodes 7A via the gate oxide film 6 and in which inversion layers are formed during ON-state operations become channel regions. Unlike the planar gate type, the channel regions are formed in a direction perpendicular to the main surfaces of the SiC substrate 1.

In the trench gate type MOSFETs, there are no JFET regions, which exist in the planar gate type MOSFETs. The JFET regions having low impurity concentrations have a high resistance value and thus cause an increase in the on-state resistance values of the MOSFETs. In contrast, the trench gate type MOSFETs that have no JFET regions are capable of reducing the on-state resistance values as compared with the planar gate type MOSFETs.

Although the silicon carbide MOSFET 300 according to Embodiment 3 illustrate a configuration in which the stress relaxation layer 54 is provided in the edge portion of the external output source electrode 10, the position in which the stress relaxation layer 54 is disposed is not limited to this edge portion. As in Embodiment 2 described with reference to FIG. 16, a configuration is also possible in which the stripe-like underlying electrode films 52b having surface asperities are provided in portions other than the edge portion of the cell arrangement region 20, in addition to the underlying electrode film 52a provided in the edge portion of the cell arrangement region 20.

Variation 1

Although the silicon carbide MOSFET 200 according to Embodiment 2 described above discloses a configuration in which the stripe-like stress relaxation layers 54b are provided in the cell arrangement region 20, the shapes and positions of the stress relaxation layers are not limited to this example.

Figure 22:
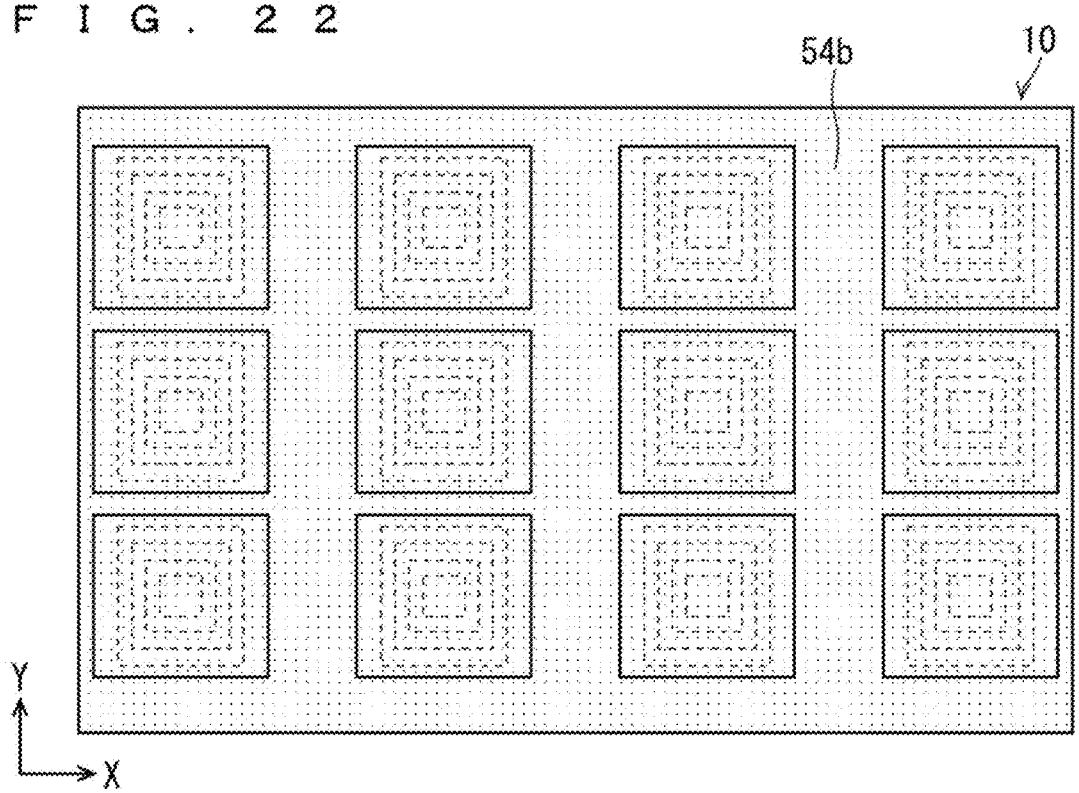
FIG. 22 is a plan view illustrating the shape and arrangement of a stress relaxation layer according to a variation of the present invention.

For example, FIG. 22 illustrates a configuration in which a stress relaxation layer 54b is provided along the Y-direction arrangements of the unit cells UC between the unit cells UC arranged in the horizontal (X-direction) and provided along the X-direction arrangements of the unit cells UC between the unit cells UC arranged in the longitudinal (Y-direction), so as to form a matrix in plan view.

The stress relaxation layer 54b does not necessarily have to be provided continuously, and may have a rectangular or circular (oval) shape in plan view.

Figure 23:
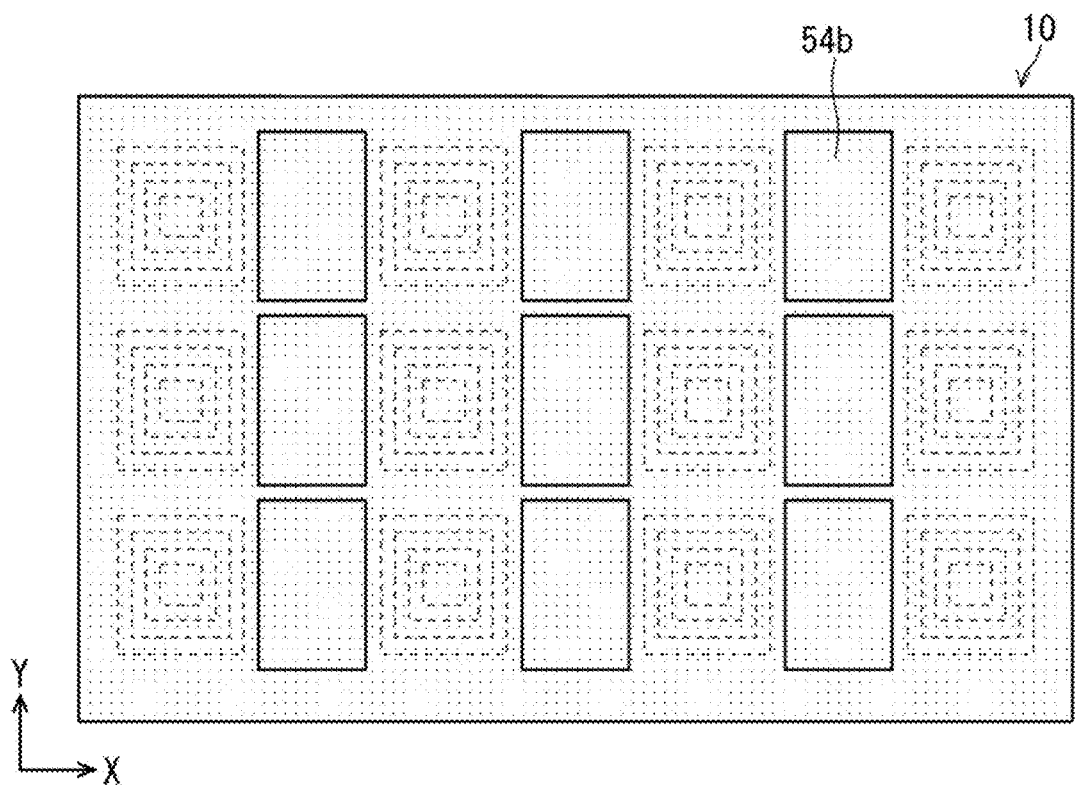
FIG. 23 is a plan view illustrating the shape and arrangement of a stress relaxation layer according to a variation of the present invention.

For example, FIG. 23 illustrates a configuration in which stress relaxation layers 54b, each having a rectangular shape in plan view, a length equivalent approximately to the Y-direction length of the unit cells UC, and a width equivalent approximately to the X-direction interval of the unit cells UC, are provided between the unit cells UC arranged in the X direction.

Figure 24:
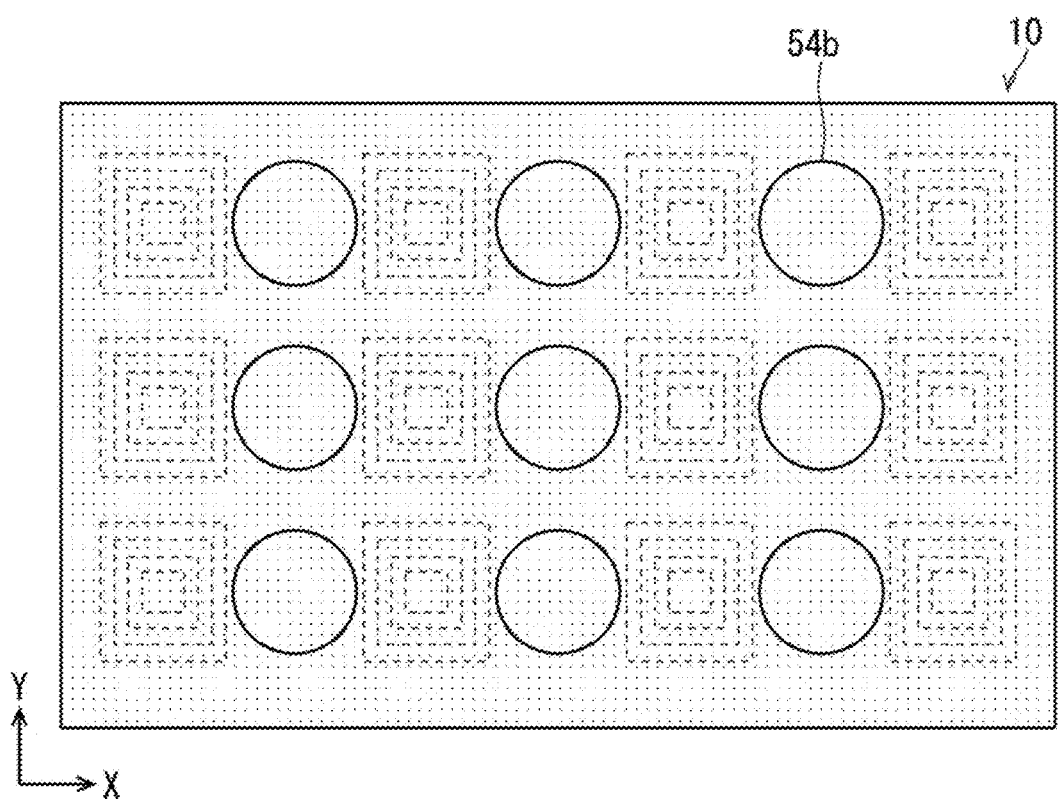
FIG. 24 is a plan view illustrating the shape and arrangement of a stress relaxation layer according to a variation of the present invention.

FIG. 24 illustrates a configuration in which stress relaxation layers 54b, each having a circular shape in plan view and a diameter equivalent approximately to the Y-direction length of the unit cells UC, are provided between the unit cells UC arranged in the X direction.

Alternatively, the arrangement of the stress relaxation layers 54b does not necessarily have to be a linear arrangement, and may be a staggered arrangement, a stripe-like arrangement, or a curved arrangement. The arrangement of the stress relaxation layers 54b may be appropriately adjusted according to the film thicknesses of the Cu films 53a and 53b and the chip size.

Variation 2

Although Embodiments 1 and 2 described above illustrate configurations in which the unit cells UC have a quadrangular shape in plan view, the same effects of the present invention are achieved even if the unit cells UC have a rectangular or polygonal shape in plan view. In the case of trench gate type MOSFETs, the only requirement is to provide trenches around the unit cells UC. Thus, there are no limitations on the shape of the unit cells UC in plan view even in the case of using the trench gate type MOSFET described in Embodiment 3.

Variation 3

Although Embodiments 1 to 3 described above illustrate configurations in which the stress relaxation layers 54b are disposed in only the cell arrangement region 20, the stress relaxation layers may be disposed in the region where the gate pad 21 is formed. The shapes and arrangements of the stress relaxation layers may be appropriately adjusted according to the film thicknesses of the Cu films 53a and 53b and the chip size.

Although Embodiments 1 to 3 illustrate configurations in which the stress relaxation layers 54b are disposed in some portions of the cell arrangement region 20, a configuration is also possible in which a stress relaxation layer 54b is disposed in the entire cell arrangement region 20. That is, the underlying electrode film 51a above the unit cells UC may be replaced by the underlying electrode film 52a.

Variation 4

Although Embodiment 1 described above illustrates a method of forming the underlying electrode film 52a with surface asperities by irradiation with Ar ions, the method of forming the underlying electrode film 52a is not limited to this example. For example, asperities may be formed by other methods such as short-time anisotropic etching using a chlorine-based gas or sandblasting in which fine $SiO_2$ particles are blasted.

Alternatively, instead of forming asperities, a modified layer may be formed on a surface. For example, it is also effective to amorphize the surface of a region of the underlying electrode film 51a that corresponds to the underlying electrode film 52a. The method of amorphization is not limited as long as the surface modification helps reducing the particle diameter of the Cu film that grows by means of electroplating. Note that the surface amorphization of the underlying electrode film generates a large number of seeds (origins) for crystal growth of the Cu film, thus reducing the crystal grain of the Cu film.

Note that the control becomes relatively easily if the underlying electrode film 52a is formed by irradiation with ions. In this case, variations in the sizes and shapes of asperities can be suppressed.

Variation 5

In order to avoid contact between the Cu films and the resin film 70, an inorganic insulation film may be provided between the Cu films 53a and 53b and the resin film 70. An insulating material for the inorganic insulation film may be a material having a breakdown strength that can withstand an electric field applied when a working voltage is applied to a power device, such as a silicon nitride film (SiN). The inorganic insulation film provided between the Cu films 53a and 53b and the resin film 70 prevents the Cu films 53a and 53b and the resin film 70 from coming into contact with each other even if a thermal stress and an external force are applied to the Cu films 53a and 53b during high-temperature operations, and therefore eliminates the possibility that copper is diffused in the resin film 70 or copper is oxidized by moisture or oxygen in the resin film 70 during high-temperature operations. This prevents degradation in protection performance of the resin film and a decrease in device reliability such as the generation of device leakage current. Accordingly, yield and productivity are substantially improved.

Variation 6

Although Embodiment 1 described above illustrates a configuration in which a MOSFET module is completed by joining a Cu wire to the Cu films 53a and 53b, it goes without saying that, even in the case of employing a structure that does not use a Cu wire e.g., in the case of employing a direct bonded copper (DBC), the present invention is applicable to the case where the thickness of Cu films is increased.

Variation 7

Although Embodiments 1 to 3 described above disclose cases where the semiconductor device is a vertical MOSFET, the same effects as obtained by the vertical MOSFET can be achieved, for example, if the present invention is applied to IGBTs having IGBT unit cells in which the conductivity type of the SiC substrate 1 illustrated in FIGS. 1, 3, and 18 is set to a p-type (second conductivity type). Accordingly, the effects of the present invention is extendable to overall switching devices having MOS structures, such as MOSFETs and IGBTs.

The present invention is also applicable to a freestanding substrate (self-supporting substrate) that is configured by only the drift layer 2 (epitaxial growth layer), from which the SiC substrate 1 has been removed either mechanically or chemically or by other methods. Note that such free-standing substrates configured by only the drift layer may also be referred to as "SiC substrates."

Variation 8

As described above, the present invention is characterized by the configurations of the external output source electrode 10 and the external output gate electrode 15 on the interlayer insulation film 8. Thus, there are no limitations on semiconductors that are used, and materials such as silicon (Si), gallium nitride (GaN), and diamond (C), may be used, instead of silicon carbide.

In the case of using semiconductor materials that have wider band gaps than silicon semiconductors such as silicon carbide, it is possible to obtain semiconductor devices that have higher breakdown voltage, higher permissible current densities, and higher heat resistance than Si semiconductor devices and that are capable of higher-temperature operations.

Embodiment 4

Application to Upper Portion of Cu Film

Although Embodiments 1 to 3 described above illustrate configurations in which the stress relaxation layer(s) is(are) provided in the lower portion of the Cu film of the silicon carbide MOSFETs, the position where the stress relaxation layer(s) is(are) disposed is not limited to these examples.

Silicon carbide MOSFETs are implemented on a module and used as a power module as described above. The mainstream of the structures of power modules is a so-called case structure. A power module having a case structure employs a configuration in which silicon carbide MOSFETs are implemented via an insulating substrate on a base plate for heat radiation, and a case that surrounds the insulating substrate and the silicon carbide MOSFETs is bonded to the base plate.

The silicon carbide MOSFETs implemented in the power module have their main electrodes (source electrode and drain electrode) connected to main electrode terminals. The connection between the main electrodes and the main electrode terminals is established by bonding wires. Also, the case is filled with a sealing resin. In order to prevent the occurrence of insulation failures during the application of a high voltage, an insulating resin in gel form, typified by silicone gel, is generally used as a sealing resin for power modules.

In the examples illustrated in Embodiments 1 to 3, the outermost surface of the external output source electrode 10 in the silicon carbide MOSFETs is the Cu film 53*a*, but according to the verification conducted by the inventors, it has been discovered that if a Cu wire is bonded to a Cu film and a case is filled with a sealing resin, cracks may occur between the sealing resin and the Cu film. In view of this, the inventors have found that additionally providing a stress relaxation layer in the upper portion of a Cu film is also effective at suppressing the occurrence of cracks.

Device Configuration

Figure 25:
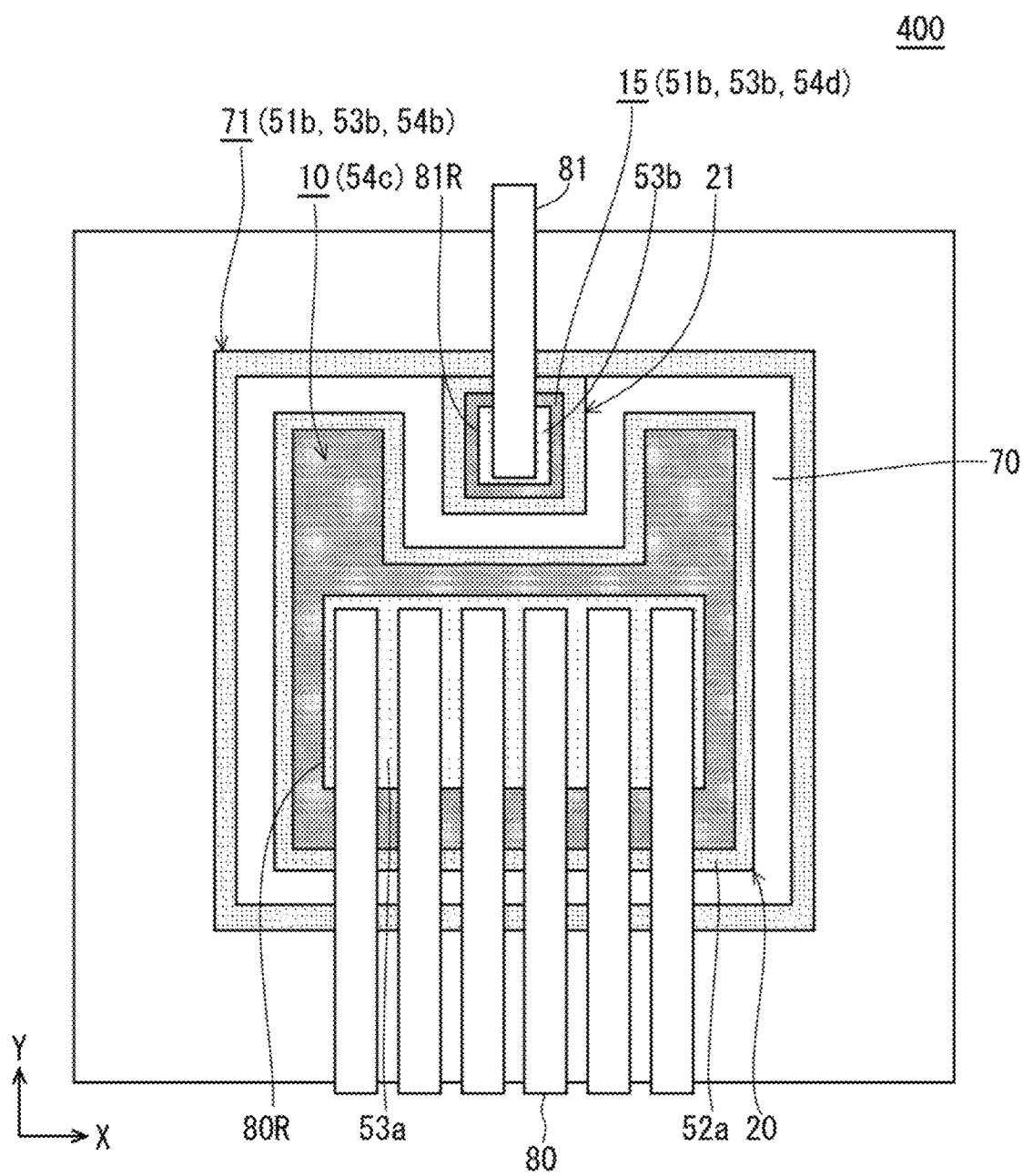

FIG. 25 is a plan view schematically illustrating an upper surface configuration of a planar gate type silicon carbide MOSFET 400 according to Embodiment 4 of the present invention. Although FIG. 25 illustrates a state of the silicon carbide MOSFET 400 in which wire bonding is performed and a case is sealed with a sealing resin, the case, a base plate for heat radiation, an insulating substrate, main electrode terminals, and the sealing resin are not shown for the sake of convenience.

As illustrated in FIG. 25, the silicon carbide MOSFET 400 has a wire joining region 80R where a Cu film 53*a* is exposed, in the central portion of the cell arrangement region 20, and in a portion other than the wire joining region 80R, the Cu film 53*a* is covered with an upper stress relaxation layer 54*c* (same as 10 in FIG. 25). The silicon carbide MOSFET 400 also has a wire joining region 81R where a Cu film 53*b* is exposed, in the central portion of the gate pad 21, and in a portion other than the wire joining region 81R, the Cu film 53*b* is covered with an upper stress relaxation layer 54*d*.

In FIG. 25, six Cu wires 80 (external connection lines) are bonded to the Cu film 53*a* in the wire joining region 80R of the cell arrangement region 20, and one Cu wire 81 (external connection line) is bonded to the Cu film 53*b* in the wire joining region 81R of the gate pad 21. The diameters of the Cu wires 80 and 81 may be selected from the range of 0.1 to 0.5 mm (100 to 500 µm).

FIG. 26 is a plan view of the silicon carbide MOSFET 400 obtained by removing the Cu wires 80 and 81 from FIG. 25. In FIG. 26, joint (bonding) areas with the Cu wires 80 and 81 in the wire joining regions 80R and 81R are respectively indicated by being enclosed in broken lines as Cu wire junctions 80*a* and 81*a*. The Cu wires 80 and 81 are respectively joined directly to the Cu films 53*a* and 53*b* at the Cu wire junctions 80*a* and 81*a*.

A sectional configuration taken along line C-C in FIG. 26 will be described with reference to the sectional view in FIG. 27. As illustrated in FIG. 27, in the silicon carbide MOSFET 400, the external output source electrode 10 is configured by underlying electrode films 51*a* and 52*a*, the Cu film 53*a*, a stress relaxation layer 54 formed in the lower portion of the Cu film, and the upper stress relaxation layer 54*c* formed in the upper portion of the Cu film. The external output gate electrode 15 is configured by an underlying electrode film 51*b*, the Cu film 53*b*, and the upper stress relaxation layer 54*d* formed in the upper portion of the Cu film.

As described in Embodiment 1, the underlying electrode film 52*a* is provided on the interlayer insulation film 8 along the edge portion of the cell arrangement region 20, and the underlying electrode film 51*a* is provided on the interlayer insulation film 8 in the remaining portion of the cell arrangement region 20 surrounded by the underlying electrode film 52*a*. Then, the stress relaxation layer 54 is provided on the underlying electrode film 52*a*, the Cu film 53*a* is provided so as to cover the entire cell arrangement region 20 including the top of the stress relaxation layer 54, and the upper stress relaxation layer 54*c* is provided in the upper layer portion of the Cu film 53*a*, except the wire joining region 80R.

The underlying electrode film 51*b* is provided on the interlayer insulation film 8 throughout the region where the gate pad 21 is formed, the Cu film 53*b* is provided on the underlying electrode film 51*b* so as to cover the entire region where the gate pad 21 is formed, and the upper stress relaxation layer 54*d* is provided in the upper layer portion of the Cu film 53*b*, except the wire joining region 81R not shown.

As illustrated in FIG. 27, the Cu wires 80 are joined to the Cu film 53*a* in the wire joining region 80R of the cell arrangement region 20. Also, the Cu wires 81 are joined to the Cu film 53*b* in the wire joining region 81R of the gate pad 21, but the wire joining region 81R and the Cu wires 81 are not shown in FIG. 27.

The upper stress relaxation layers 54*c* and 54*d* are Cu films whose grain sizes are less than or equal to 1 µm. The upper stress relaxation layers 54*c* and 54*d* have film thicknesses of 0.5 to 5 µm. Like the stress relaxation layer 54, these upper stress relaxation layers 54*c* and 54*d* having small grain sizes function as stress relaxation layers.

As illustrated in FIG. 27, the Cu wires 80 and 81 and the silicon carbide MOSFET 400 (FIG. 25) are sealed in a case (not shown) with a sealing resin 90 such as silicone gel.

The upper stress relaxation layers 54c and 54d are provided in order to relax the stress applied to the Cu films 53a and 53b and are thus capable of preventing the occurrence of cracks between the sealing resin 90 and the upper stress relaxation layers 54c and 54d due to the stress.

As described above, the silicon carbide MOSFET 400 according to Embodiment 4 also achieves the effect of preventing the occurrence of cracks in the sealing resin 90, in addition to the effect of preventing the occurrence of cracks in the vicinity of the junction between the silicon oxide film 14 and the gate oxide film 6, by providing the upper stress relaxation layers 54c and 54d in the upper portion of the Cu films.

Method of Manufacturing Upper Stress Relaxation Layers

The upper stress relaxation layers 54c and 54d may be formed by the following method. Specifically, after the silicon carbide MOSFET 100 has been manufactured through the steps described with reference to FIGS. 4 to 15, a mask is formed of a resist material or other materials so as to cover portions of the Cu films 53a and 53b that become the wire joining regions 80R and 81R, and then the Cu films 53a and 53b that are not covered with the mask are irradiated with Ar ions. Thereafter, the mask is removed, and annealing is performed at a temperature of 100 to 300° C. The Cu films 53a and 53b irradiated with Ar ions change respectively into the upper stress relaxation layers 54c and 54d, each having a grain size of approximately 1 µm and a thickness of approximately 1 µm.

Alternatively, the upper stress relaxation layers 54c and 54d may be formed by applying a load of 100 to 1000 N/cm² to the Cu films 53a and 53b in the region other than the wire joining regions 80R and 81R. In this case, the Cu films 53a and 53b having received the load respectively become the upper stress relaxation layers 54c and 54d, each having a grain size of approximately 1 µm and a thickness of approximately 5 µm.

Note that the grain size according to Embodiments 1 to 4 of the present invention described above is defined as the length of one side of squares when crystal grains are converted into squares having the same area in a section of the Cu films, i.e., defined as a so-called diameter corresponding to the area.

Variation 1

According to Embodiment 4 described above, in consideration of the possibility of misalignment of the Cu wires 80 and 81, there are spaces of approximately 1 to 10 µm between the edge portions of the Cu wire junctions 80a and 81a and the edge portions of the wire joining regions 80R and 81R as illustrated in FIG. 26. That is, the wire joining regions 80R and 81R are formed larger than the Cu wire junctions 80a and 81a in order to prevent the Cu wire junctions 80a and 81a from overlapping respectively with the upper stress relaxation layers 54c and 54d.

However, the Cu wire junctions 80a and 81a may overlap respectively with the upper stress relaxation layers 54c and 54d. That is, there may be no spaces between the edge portions of the Cu wire junctions 80a and 81a and the edge portions of the wire joining regions 80R and 81R. The range where the upper stress relaxation layers 54c and 54d are formed may be set with the condition that no cracks occur between the upper stress relation layers and the sealing resin 90.

Note that the Cu wire junctions 80a and 81a may overlap in part respectively with the upper stress relaxation layers 54c and 54d. Since the upper stress relaxation layers 54c and 54d are also formed of Cu, no problem arises with the junctions of the Cu wires 80 and 81 even if the Cu wire junctions 80a and 81a overlap in part respectively with the upper stress relaxation layers 54c and 54d.

In yet other words, a configuration is also possible in which the Cu wires 80 and 81 are joined to the upper stress relaxation layers 54c and 54 without the provision of the wire joining regions 80R and 81R where the Cu films 53a and 53b are exposed, respectively in the cell arrangement region 20 and the gate pad 21. By not providing the wire joining regions 80R and 81R, the masking step becomes unnecessary, and the cost of manufacture can be reduced.

Other Variations

Although Embodiment 4 illustrates a configuration in which the six Cu wires 80 are joined to the cell arrangement region 20, the number of wires is not limited to this example. The number of wires may be appropriately selected depending on, for example, the chip size of the silicon carbide MOSFET, the current value, and the diameter of the Cu wires.

Although Embodiment 4 takes the example of a case where a silicone resin is used as the sealing resin 90, the present invention is not limited to this example, and the sealing resin 90 may be other resins such as an epoxy resin, a polyimide resin, or an acrylic resin. Although the sealing resin 90 is usually used with an addition of ceramic powder such as $Al_2O_3$ or $SiO_2$, the present invention is not limited thereto. The scaling resin 90 may be used with an addition of another material such as AlN, BN, $Si_3N_4$, diamond, SiC, or $B_2O_3$ or with an addition of resin powder such as silicone resin powder or acrylic resin powder.

Embodiment 5

The present embodiment describes a case where the silicon carbide semiconductor devices according to Embodiments 1 and 4 are applied to a power converter. The present invention is not limited to a specific power converter, but the following description takes the example of a case where the present invention is applied to a three-phase inverter as Embodiment 5.

FIG. 28 is a block diagram illustrating a configuration of a power conversion system to which the power converter according to the present embodiment is applied.

The power conversion system illustrated in FIG. 28 is configured by a power supply 500, a power converter 600, and a load 700. The power supply 500 is a direct-current power supply and supplies direct-current power to the power converter 600. The power supply 500 may be configured by various constituent elements such as a direct-current system, a solar cell, and a storage battery, or may be configured by a rectifier circuit or an AC/DC converter that is connected to an alternating-current system. As another alternative, the power supply 500 may be configured by a DC/DC converter that converts direct-current power output from a direct-current system to predetermined power.

The power converter 600 is a three-phase inverter that is connected between the power supply 500 and the load 700, and converts direct-current power supplied from the power supply 500 to alternating-current power and supplies the alternating-current power to the load 700. The power converter 600 includes a main converter circuit 601 that converts direct-current power to alternating-current power and outputs the alternating-current power, a drive circuit 602 that outputs a driving signal for driving each switching element of the main converter circuit 601, and a control circuit 603 that outputs a control signal for controlling the drive circuit 602 to the drive circuit 602, as illustrated in FIG. 28.

The load 700 is a three-phase electric motor that is driven by the alternating-current power supplied from the power converter 600. Note that the use of the load 700 is not limited to specific applications, and the load 700 is an electric motor mounted on various types of electric apparatuses. The load 700 may be used as an electric motor for hybrid automobiles, electric automobiles, railway vehicles, elevators, or air conditioners.

The details of the power converter 600 will be described hereinafter. The main converter circuit 601 includes switching elements and freewheel diodes (not shown), and converts direct-current power supplied from the power supply 500 to alternating-current power and supplies the alternating-current power to the load 700 by switching the switching elements. The main converter circuit 601 may take various types of specific circuit configurations, and the main converter circuit 601 according to the present embodiment is a two-level three-phase full-bridge circuit that may be configured by six switching elements and six freewheel diodes that are respectively connected in anti-parallel with the six switching elements. The silicon carbide semiconductor device according to one of Embodiments 1 to 4 described above is applied to each switching element of the main converter circuit 601. Each two of the six switching elements are connected in series and constitute upper and lower arms, and each pair of upper and lower arms constitutes each phase (U phase, V phase, or W phase) of the full-bridge circuit. The output terminal for each pair of upper and lower arms, i.e., three output terminals of the main converter circuit 601, are connected to the load 700.

The drive circuit 602 generates driving signals for driving the switching elements of the main converter circuit 601 and supplies the driving signals to the control electrodes of the switching elements of the main converter circuit 601. Specifically, the drive circuit 602 outputs a driving signal for turning a switching element on and a driving signal for turning a switching element off to the control electrode of each switching element, in accordance with the control signal received from the control circuit 603, which will be described later. In the case of maintaining a switching element in the ON state, the driving signal is a voltage signal (on signal) having a value greater than or equal to the threshold voltage of the switching element, and in the case of maintaining a switching element in the OFF state, the driving signal is a voltage signal (off signal) having a value less than or equal to the threshold value of the switching element.

The control circuit 603 controls the switching elements of the main converter circuit 601 so that desired power is supplied to the load 700. Specifically, on the basis of power that is to be supplied to the load 700, the control circuit 603 calculates the time (ON time) when each switching element of the main converter circuit 601 is to be turned on. For example, the main converter circuit 601 may be controlled by PWM control in which the ON time of each switching element is modulated in accordance with the voltage that is to be output. Then, the control circuit 603 outputs a control command (control signal) to the drive circuit 602 so that, at each time, the ON signal is output to a switching element that is to be turned on, and the OFF signal is output to a switching element that is to be turned off. In accordance with this control signal, the drive circuit 602 outputs either the ON signal or the OFF signal as a driving signal to the control electrode of each switching element.

The power converter according to the present embodiment applies the silicon carbide semiconductor device according to one of Embodiments 1 to 4 to the switching elements of the main converter circuit 601. Thus, even if the thickness of the Cu film in the cell arrangement region is increased to 20 µm, the stress of the Cu film is relaxed and the occurrence of cracks in the vicinity of the junction between the silicon oxide film and the gate oxide film is prevented.

Although the present embodiment describes an example in which the present invention is applied to a two-level three-phase inverter, the present invention is not limited to this example and is also applicable to various types of power converters. Although the present embodiment describes a two-level power converter as an example, the present invention may be applied to a three-level or multilevel power converter, or may be applied to a single-phase inverter if power is supplied to a single-phase load. The present invention is also applicable to a DC/DC converter or an AC/DC converter if power is supplied to a direct-current load or the like.

The use of the power converter to which the present invention is applied is not limited to the case where the aforementioned load is an electric motor. For example, the power converter may be used as power supply devices for electrical discharge machines or laser beam machines or for cooking appliances or non-contact power supply systems, or may be used as power conditioners for systems such as photovoltaic power generating systems and electrical condenser systems.

Note that embodiments of the present invention may be freely combined or appropriately modified or omitted within the scope of the invention.

The invention claimed is:

1. A semiconductor device comprising:

a semiconductor substrate;

a semiconductor layer of a first conductivity type disposed on a first main surface of the semiconductor substrate;

a first semiconductor region of a second conductivity type selectively provided in an upper layer portion of the semiconductor layer;

a second semiconductor region of the first conductivity type selectively provided in an upper layer portion of the first semiconductor region;

a gate insulation film provided in contact with surfaces of the first and second semiconductor regions and the semiconductor layer;

an insulation film that is thicker than the gate insulation film and provided in a region of the semiconductor layer in which the gate insulation film is not provided;

a gate electrode provided on at least the gate insulation film;

an interlayer insulation film provided to cover the gate electrode;

a contact hole formed through the gate insulation film and the interlayer insulation film and exposing at least the second semiconductor region at a bottom thereof;

a first main electrode provided on the interlayer insulation film and electrically connected to the second semiconductor region via the contact hole; and a second main electrode disposed on a second main surface of the semiconductor substrate, wherein the first main electrode includes:

an underlying electrode film connected to the second semiconductor region via the contact hole; and a copper film provided on the underlying electrode film, and the copper film has a thickness greater than or equal to 15 μm, and the copper film includes a stress relaxation layer which is outside of said contact hole and has a smaller grain size than another portion of the copper film, the stress relaxation layer being above a region that includes at least a junction between the gate insulation film and the insulation film.

2. The semiconductor device according to claim 1, further comprising:

an external connection line electrically connected to the copper film; and the sealing resin provided on the copper film that includes the external connection line, wherein the stress relaxation layer is provided at a junction between the sealing resin and the copper film.

3. The semiconductor device according to claim 1, wherein the grain size of the stress relaxation layer is in a range of 0.1 to 1 μm.

4. The semiconductor device according to claim 1, wherein the underlying electrode film includes asperities on at least a part of a surface in contact with the copper film.

5. The semiconductor device according to claim 1, wherein the semiconductor substrate is a silicon carbide semiconductor substrate.

6. A power converter comprising:

a main converter circuit that includes the semiconductor device according to claim 1 and converts and outputs input power;

a drive circuit that outputs a driving signal for driving the semiconductor device to the semiconductor device; and a control circuit that outputs a control signal for controlling the drive circuit to the drive circuit.

* * * * *